United States Patent
Takenaga et al.

(10) Patent No.: US 8,013,407 B2
(45) Date of Patent: Sep. 6, 2011

(54) MAGNETIC MEMORY DEVICE HAVING A RECORDING LAYER

(75) Inventors: Takashi Takenaga, Tokyo (JP);
Takeharu Kuroiwa, Tokyo (JP);
Hiroshi Takada, Tokyo (JP); Shuichi Ueno, Tokyo (JP); Kiyoshi Kawabata, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 18 days.

(21) Appl. No.: 12/399,760

(22) Filed: Mar. 6, 2009

(65) Prior Publication Data

US 2009/0250776 A1 Oct. 8, 2009

(30) Foreign Application Priority Data

Apr. 3, 2008 (JP) ................. 2008-096975

(51) Int. Cl.
*H01L 29/82* (2006.01)
*G11C 11/02* (2006.01)

(52) U.S. Cl. .......... 257/421; 257/20; 257/414; 257/422; 257/423; 257/E29.323; 438/3; 360/324; 360/324.2; 365/157; 365/171

(58) Field of Classification Search ............... 257/20, 257/414, 421–427, E29.323; 438/3; 360/313, 360/324–326; 365/157–158, 171–173; 29/37
See application file for complete search history.

(56) References Cited

U.S. PATENT DOCUMENTS

| | | | |
|---|---|---|---|
| 6,005,800 A | 12/1999 | Koch et al. | |
| 6,165,803 A | 12/2000 | Chen et al. | |
| 6,368,878 B1 | 4/2002 | Abraham et al. | |
| 6,570,783 B1 | 5/2003 | Deak | |
| 6,605,836 B2 | 8/2003 | Kishi et al. | |
| 7,009,875 B2 | 3/2006 | Johnson | |
| 2004/0100855 A1* | 5/2004 | Saito et al. | 365/232 |
| 2005/0276090 A1* | 12/2005 | Yamagishi | 365/145 |

FOREIGN PATENT DOCUMENTS

| | | |
|---|---|---|
| JP | 11-273337 | 10/1999 |
| JP | 2000-353791 | 12/2000 |

(Continued)

OTHER PUBLICATIONS

Mosca et al., "Oscillatory interlayer coupling and giant magnetoresistance in Co/Cu multilayers,"Journal of Magnetism and Magnetic Materials 94 (1991) pp. L1-L5.

(Continued)

*Primary Examiner* — Jami M Valentine
(74) *Attorney, Agent, or Firm* — McDermott Will & Emery LLP

(57) ABSTRACT

There is provided a magnetic memory device stable in write characteristics. The magnetic memory device has a recording layer. The planar shape of the recording layer has the maximum length in the direction of the easy-axis over a primary straight line along the easy-axis, and is situated over a length smaller than the half of the maximum length in the direction perpendicular to the easy-axis, and on the one side and on the other side of the primary straight line respectively, the planar shape has a first part situated over a length in the direction perpendicular to the easy-axis, and a second part situated over a length smaller than the length in the direction perpendicular to the easy-axis. The outer edge of the first part includes only a smooth curve convex outwardly of the outer edge.

5 Claims, 13 Drawing Sheets

FOREIGN PATENT DOCUMENTS

| | | |
|---|---|---|
| JP | 2002-280637 | 9/2002 |
| JP | 2004-296858 | 10/2004 |
| JP | 2005-310971 | 11/2005 |

OTHER PUBLICATIONS

Parkin et al., "Oscillatory Magnetic Exchange Coupling through Thin Copper Layers," Physical Review Letters, vol. 66, No. 16, Apr. 1991, pp. 2152-2155.

Pratt et al., "Perpendicular Giant Magnetoresistances of Ag/Co Multilayers," Physical Review Letters, vol. 66, No. 23, Jun. 1991, pp. 3060-3063.

Miyazaki et al., "Giant magnetic tunneling effect in Fe/Al2O3/Fe junction," Journal of Magnetism and Magnetic Materials 139 (1995), pp. L231-L234.

Tehrani et al., High density submicron magnetoresistive random access memory (invited), Journal of Applied Physics, vol. 85, No. 8 Apr. 1999, pp. 5822-5827.

Parkin et al., Exchange-biased magnetic tunnel junctions and application to nonvolatile magnetic random access memory (invited), Journal of Applied Physics, vol. 85, No. 8 Apr. 1999, pp. 5828-5833.

ISSCC 2001 Dig of Tech Papers, p. 122.

* cited by examiner

MEMORY CELL REGION (MR)

FIG. 10(a) MEMORY CELL REGION (MR)

S TYPE STATE

C TYPE STATE

MAGNETIC MEMORY DEVICE HAVING A RECORDING LAYER

CROSS-REFERENCE TO RELATED APPLICATIONS

The disclosure of Japanese Patent Application No. 2008-96975 filed on Apr. 3, 2008 including the specification, drawings and abstract is incorporated herein by reference in its entirety.

BACKGROUND OF THE INVENTION

The present invention relates to a magnetic memory device. More particularly, it relates to a magnetic memory device having a recording layer.

The magnetoresistive (MR) effect is a phenomenon that the electric resistance is changed by applying a magnetic field to a magnetic substance, and is utilized for a magnetic field sensor, a magnetic head, and the like. Particularly, as giant magnetoresistance (GMR) effect materials exhibiting a very large magnetoresistive effect, artificial lattice films of Fe/Cr, Co/Cu, and the like are introduced in Non-Patent Documents 1 and 2.

Whereas, there is proposed a magnetoresistive effect element using a lamination structure comprised of ferromagnetic layer/non-magnetic layer/ferromagnetic layer/antiferromagnetic layer having a non-magnetic metal layer which is thick to such a degree as to eliminate the exchange coupling action between the ferromagnetic layers. In this element, the ferromagnetic layer and the antiferromagnetic layer are exchange coupled to each other. Thus, the magnetic moment of the ferromagnetic layer is fixed, so that only the spin of the other ferromagnetic layer can be reversed with ease in the external magnetic field. This is an element known as a so-called spin valve film. With this element, the exchange coupling between the two ferromagnetic layers is weak, and hence the spin can be reversed in a small magnetic field. For this reason, the spin valve film can provide a magnetoresistive element with a higher sensitivity than that of the exchange coupled film. As the antiferromagnetic substance, FeMn, IrMn, PtMn, or the like is used. In the spin valve film, an electric current is made to flow in the film in-plane direction for use. Thus, the spin valve film is used for a reproducing head for high density magnetic recording because of its feature as described above.

On the other hand, Non-Patent Document 3 discloses as follows: Use of the perpendicular magnetoresistive effect of making an electric current flow in the direction perpendicular to the film plane provides a further larger magnetoresistive effect.

Further, Non-Patent Document 4 also discloses a tunneling magnetoresistive (TMR) effect due to the ferromagnetic tunnel junction. The tunneling magnetoresistance is produced by using the following: in a three-layer film including ferromagnetic layer/insulation layer/ferromagnetic layer, the spins of the two ferromagnetic layers are caused to be parallel or anti-parallel to each other by the external magnetic field, resulting in a difference in magnitude between the tunnel currents in the direction perpendicular to the film plane.

In recent years, the studies on use of GMR and TMR elements for a nonvolatile magnetic memory semiconductor device (MRAM: magnetic random access memory) have been shown in, for example, Non-Patent Documents 5 to 7.

In this case, studies have been made on a pseudo-spin valve element in which a non-magnetic metal layer is sandwiched between two ferromagnetic layers having different coercive forces, and a ferromagnetic tunneling effect element. When these elements are used for an MRAM, these elements are arranged in a matrix. Thus, an electric current is made to flow to an additionally provided wire, so that a magnetic field is applied thereto. As a result, the two magnetic layers forming each element are controlled to be parallel or anti-parallel to each other, so that "1" or "0" are recorded. Reading is performed by using the GMR and TMR effects.

For an MRAM, the use of the TMR effect results in a lower power consumption than the use of the GMR effect, and hence, use of the TMR element has been mainly studied. With an MRAM using a TMR element, the MR ratio is as large as 20% or more at room temperature, and the resistance at the tunnel junction is large. Therefore, a larger output voltage can be obtained. Whereas, with the MRAM using a TMR element, spin reversal is not required to be performed for reading, so that reading is possible with the less current. For this reason, the MRAM using a TMR element has been expected as a low power consumption type nonvolatile semiconductor memory device capable of high-speed writing/reading.

For the write operation of the MRAM, it is desired that the magnetic characteristics of the ferromagnetic layers in the TMR element are controlled. Specifically, there are demands for a technology of controlling the relative magnetization directions of two ferromagnetic layers interposing a non-magnetic layer are controlled to be parallel/anti-parallel, and a technology of causing the magnetization reversal of one magnetic layer in a desired cell with reliability and efficiency. The technologies of controlling the relative magnetization directions of two ferromagnetic layers interposing a non-magnetic layer to be uniformly parallel/anti-parallel in the film plane by using two crossing wires are disclosed in, for example, Patent Documents 1, 3, 4, and 7.

Whereas, for an MRAM, when cell size reduction is carried out for higher integration, the reversing magnetic field increases due to the demagnetizing field depending upon the size in the direction of the film plane of the magnetic layer. As a result, a large magnetic field is required for writing, and the power consumption also increases. For this reason, as shown in the Patent Documents 2, 5, 6, and 7, there are proposed technologies whereby the shape of the ferromagnetic layer is optimized, thereby to facilitate magnetization reversal.

[Non-Patent Document 1] D. H. Mosca et al., "Oscillatory interlayer coupling and giant magnetoresistance in Co/Cu multilayers", Journal of Magnetism and Magnetic Materials 94 (1991) pp. L1-L5

[Non-Patent Document 2] S. S. P. Parkin et al., "Oscillatory Magnetic Exchange Coupling through Thin Copper Layers", Physical Review Letters, vol. 66, No. 16, 22 Apr. 1991, pp. 2152-2155

[Non-Patent Document 3] W. P. Pratt et al., "Perpendicular Giant Magnetoresistances of Ag/Co Multilayers", Physical Review Letters, vol. 66, No. 23, 10 Jun. 1991, pp. 3060-3063

[Non-Patent Document 4] T. Miyazaki et al., "Giant magnetic tunneling effect in Fe/Al2O3/Fe junction", Journal of Magnetism and Magnetic Materials 139 (1995), pp. L231-L234

[Non-Patent Document 5] S. Tehrani et al., "High density submicron magnetoresistive random access memory (invited)", Journal of Applied Physics, vol. 85, No. 8, 15 Apr. 1999, pp. 5822-5827

[Non-Patent Document 6] S. S. P. Parkin et al., "Exchange-biased magnetic tunnel junctions and application to nonvolatile magnetic random access memory (invited)", Journal of Applied Physics, vol. 85, No. 8, 15 Apr. 1999, pp. 5828-5833

[Non-Patent Document 7] ISSCC 2001 Dig of Tech. Papers, p. 122

[Patent Document 1] Japanese Unexamined Patent Publication No. Hei 11 (1999)-273337
[Patent Document 2] Japanese Unexamined Patent Publication No. 2002-280637
[Patent Document 3] Japanese Unexamined Patent Publication No. 2000-353791
[Patent Document 4] U.S. Pat. No. 6,005,800
[Patent Document 5] Japanese Unexamined Patent Publication No. 2004-296858
[Patent Document 6] U.S. Pat. No. 6,570,783
[Patent Document 7] Japanese Unexamined Patent Publication No. 2005-310971

SUMMARY OF THE INVENTION

However, a conventional MRAM has the following problems.

According to the Patent Document 3, the MRAM memory cell requires two crossing wiring layers, a magnetic memory element, a transistor element, and a coupling member for electrically coupling the magnetic memory element and the transistor element. The magnetic memory element has a recording layer and a pinned layer which are ferromagnetic substances, and a non-magnetic layer interposed between the recording layer and the pinned layer.

For reading of information, the electric current flowing through the magnetic memory element via prescribed wiring is detected based on the resistance of the magnetic memory device. On the other hand, for rewriting of information, the magnetization direction of the recording layer of a specific magnetic memory element to be applied with a synthetic magnetic field generated by making an electric current flow through both of the two crossing wiring layers is selectively reversed. At this step, the shape of the recording layer in the magnetic memory element is made symmetric with respect to the hard-axis, and made asymmetric with respect to the easy-axis. This can expand the rewritable magnetic field region. This is disclosed in the Patent Documents 5 and 6.

Herein, with a highly integrated device such as an MRAM, it is actually difficult to control the shape of the recording layer evenly for all the magnetic memory elements. This problem becomes more remarkable with size reduction of the recording layer. Particularly, it is difficult to obtain a symmetric shape with respect to the hard-axis. When the shape is asymmetric, unfavorably, the write currents for "1" and "0" at the same bit differ in magnitude. For the asymmetric recording layer, the magnetization distribution is controlled by the shape thereof. Accordingly, the write characteristics vary from one bit to another with variations of the shape such as asymmetry with respect to the hard-axis. This unfavorably makes writing difficult.

Namely, in a magnetic memory element having the recording layer shape asymmetric with respect to the easy-axis, when the shape is asymmetric with respect to the hard-axis, the write characteristics vary from one bit to another. This unfavorably makes unstable the operation of the magnetic memory device.

In view of the foregoing problems, the present invention was completed. It is therefore an object of the present invention to provide a magnetic memory device stable in write characteristics.

The magnetic memory device of the present invention has: a substrate, a first wire, a second wire, and a recording layer. The first wire is arranged over the substrate, and has a part extending with a first axis as the central axis along the first axis. The second wire is arranged over the substrate, has a part extending with a second axis crossing with the first axis as the central axis along the second axis, and crosses with the first wire with a space in the direction of thickness of the substrate provided therebetween. The recording layer has a planar shape, is placed so as to be at least partially interposed between the first wire and the second wire in the region in which the first wire and the second wire cross each other with the space provided therebetween, has an easy-axis, and is changed in magnetization direction by the synthetic magnetic field of the magnetic field by the first wire and the magnetic field by the second wire. The planar shape has the maximum length in the direction of the easy-axis over a primary straight line along the easy-axis, and is situated over a length smaller than the half of the maximum length in the direction perpendicular to the easy-axis, and on the one side and on the other side of the primary straight line respectively, the planar shape has a first part situated over a length a in the direction perpendicular to the easy-axis, and a second part situated over a length b smaller than the length a in the direction perpendicular to the easy-axis. The outer edge of the first part includes only a smooth curve convex outwardly of the outer edge.

According to the present invention, the planar shape of the recording layer is a shape capable of increasing the radius of curvature of the C type magnetization distribution, and a shape formed stably by photolithography. This controls variations in the current necessary for changing the magnetization direction of the recording layer, namely, the write current. As a result, it is possible to obtain a magnetic memory device stable in write characteristics.

BRIEF DESCRIPTION OF THE DRAWINGS

FIG. 10(a) is a schematic cross sectional view showing a fourth step of the manufacturing method of the magnetic memory device in one embodiment of the present invention.

DETAILED DESCRIPTION OF THE PREFERRED EMBODIMENTS

Below, embodiments of the present invention will be described by reference to the accompanying drawings.

Embodiment 1

Circuit and Structure of Memory Cell

First, for a magnetic memory device in Embodiment 1 of the present invention, a description will be given to the memory cell circuit of the magnetic memory device.

Figure 1:
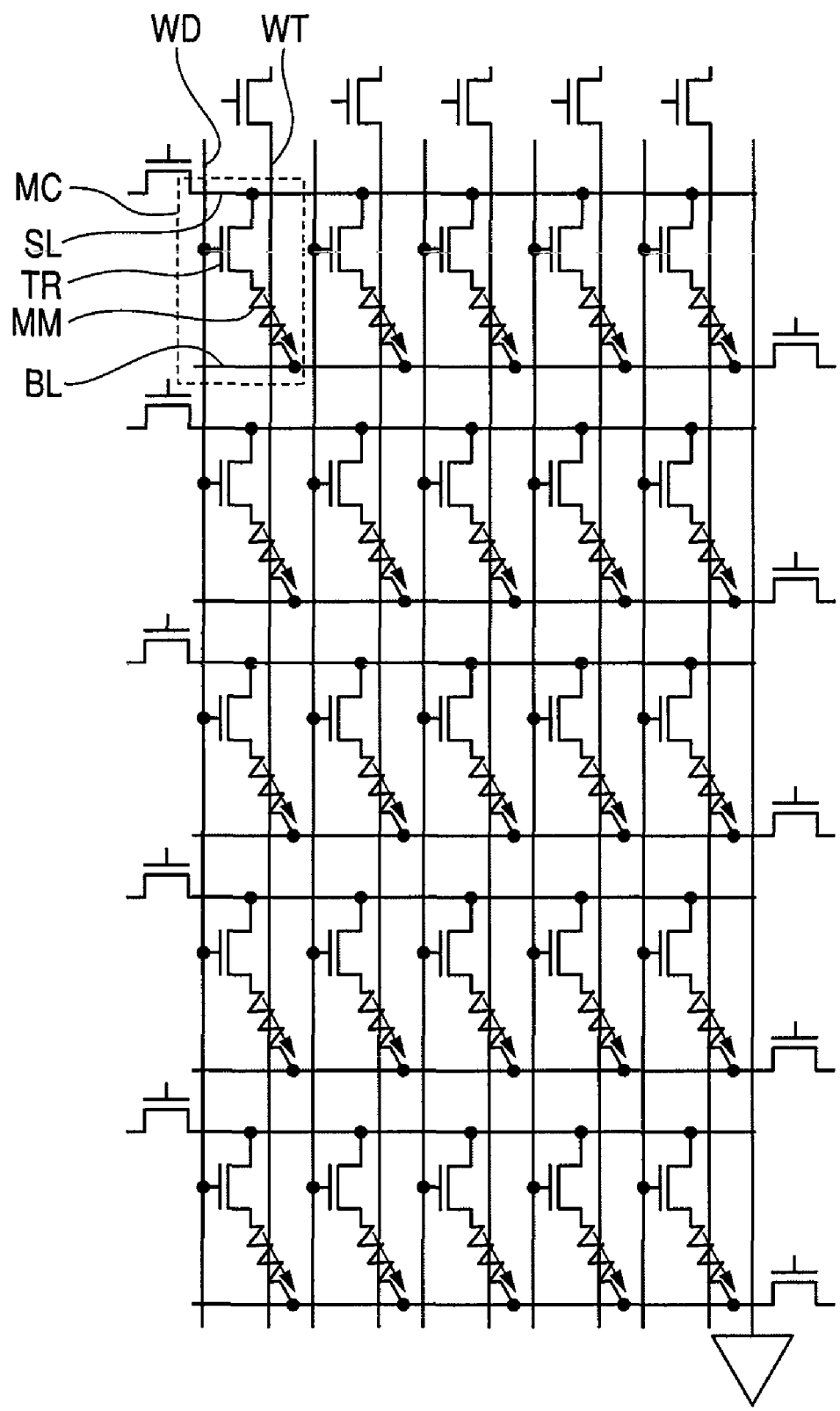
FIG. 1 is a circuit diagram of a memory cell of a magnetic memory device in one embodiment of the present invention.

FIG. 1 is a circuit diagram of memory cells of the magnetic memory device in Embodiment 1 of the present invention. Referring to FIG. 1, in the magnetic memory device, one memory cell MC (within the dotted line frame) includes an element selection transistor TR, and a magnetic memory element (ferromagnetic tunnel junction element) MM. A plurality of the memory cells MC are formed in a matrix.

For the magnetic memory element MM, a write line WT and a bit line BL for performing rewriting and reading of information cross each other. The bit line BL is electrically coupled to respective one end sides of the magnetic memory elements MM arranged in one direction (e.g., row).

On the other hand, the write line WT is arranged so as to enable application of a magnetic field to respective magnetic memory elements MM arranged in the other direction (e.g., column). Further, the other end sides of the magnetic memory elements MM are electrically coupled to the drain sides of the element selection transistors TR. The respective source sides of the element selection transistors TR arranged in one direction are electrically coupled by a source line SL. Whereas, the respective gates of the element selection transistors TR arranged in the other direction are electrically coupled to one another by a word line WD.

Then, a description will be given to the structure of the magnetic memory device in this embodiment.

Figure 2:
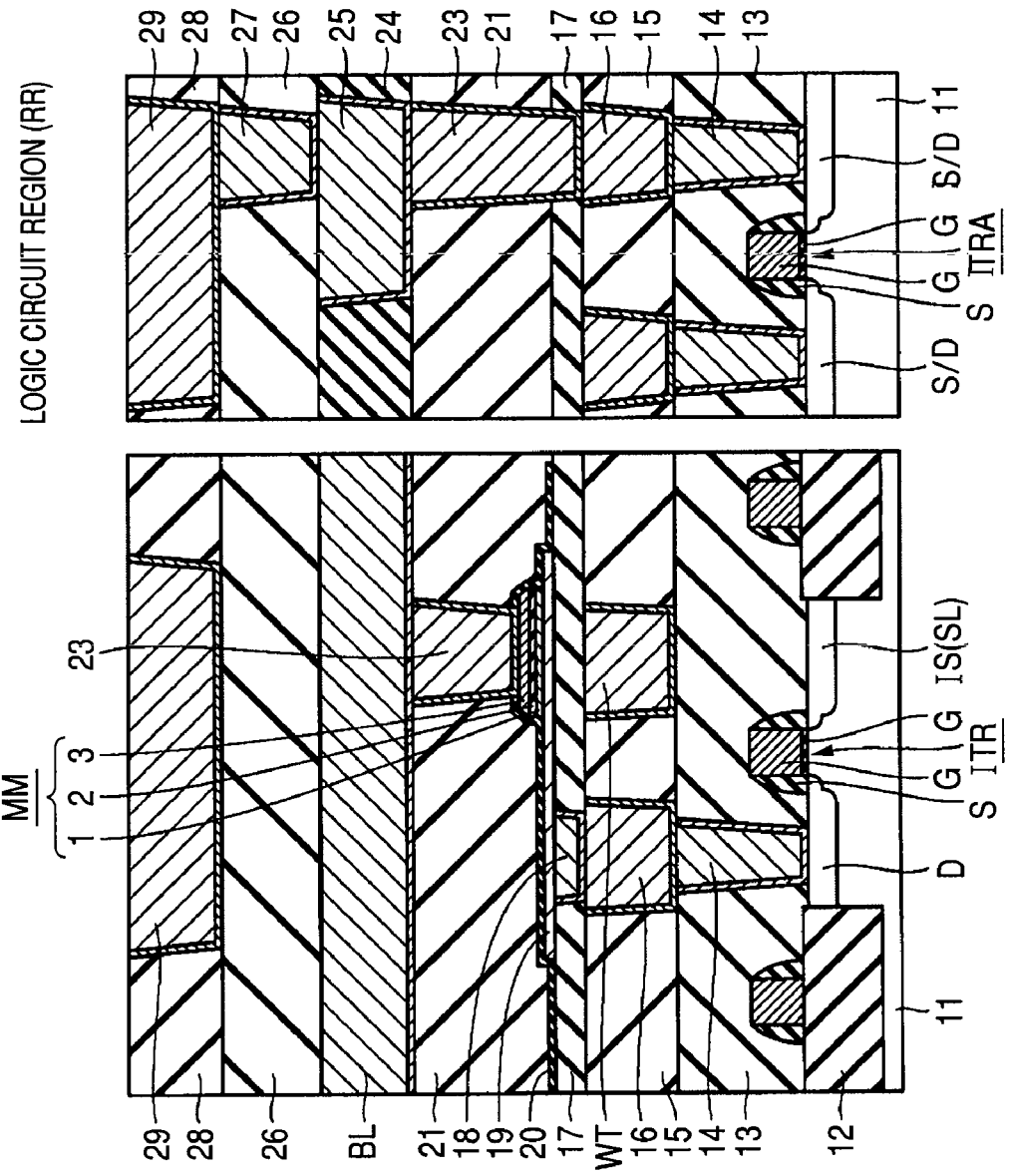
FIG. 2 is a schematic cross sectional view showing the configuration of the magnetic memory device in one embodiment of the present invention.

FIG. 2 is a schematic cross sectional view showing the configuration of the magnetic memory device in Embodiment 1 of the present invention. Referring to FIG. 2, in a memory cell region MR in a semiconductor substrate 11, an element selection transistor TR is formed over the surface of the element formation region (surface of the semiconductor substrate 11) defined by an element isolation insulation film 12. The element selection transistor TR mainly has a drain region D, a source region S, and a gate electrode main body G. The drain region D and the source region S are formed with a prescribed distance away from each other in the surface of the semiconductor substrate 11. The drain region D and the source region S are mutually formed of impurity regions of a prescribed conductivity type. The gate electrode main body G is formed over the region interposed between the drain region D and the source region S via a gate insulation film GI. The sidewall of the gate electrode main body G is covered with a sidewall-like sidewall insulation film SI.

An interlayer insulation film 13 is formed in such a manner as to cover the element selection transistor TR. The interlayer insulation film 13 includes a hole, provided therein, reaching the drain region D from the top side thereof. A coupling member 14 is formed in the hole. Over the interlayer insulation film 13, an interlayer insulation film 15 is formed. In the interlayer insulation film 15, there are formed a hole reaching the coupling member 14 and a hole reaching the interlayer insulation film 15 from the tope side thereof. The write line WT and a coupling member 16 are formed in the respective holes. The coupling member 16 is electrically coupled to the drain region D by the coupling member 14.

An interlayer insulation film 17 is formed over the interlayer insulation film 13 in such a manner as to cover the write line WT and the coupling member 16. The interlayer insulation film 17 includes a hole, provided therein, reaching the coupling member 16 from the top side thereof. A coupling member 18 is formed in the hole. Over the interlayer insulation film 17, an electrically conductive layer 19 and a magnetic memory element MM are formed. The electrically conductive layer 19 is electrically coupled to the drain region D by the coupling members 18, 16, and 14.

The magnetic memory element MM is a magnetoresistive effect element, and has a pinned layer 1, a tunnel insulation layer 2 which is a non-magnetic layer, and a recording layer 3, sequentially stacked from the bottom. The pinned layer 1 is formed in such a manner as to be in contact with the electrically conductive layer 19.

A protective film 20 is formed in such a manner as to cover the magnetic memory element MM. Over the protective film 20, an interlayer insulation film 21 is formed. The protective film 20 and the interlayer insulation film 21 include a hole, provided therein, penetrating through the films 20 and 21, and reaching the recording layer 3. In the hole, a coupling member 23 is formed. Over the interlayer insulation film 21, the bit line BL is formed. The bit line BL is electrically coupled to the magnetic memory element MM by the coupling member 23.

An interlayer insulation film 26 is formed in such a manner as to cover the bit line BL. Over the interlayer insulation film 21, a prescribed wiring layer 29 and insulation layer 28 are formed.

On the other hand, in the peripheral (logic) circuit region RR in the semiconductor substrate 11, a transistor TRA forming the logic circuit is formed. The transistor TRA has a pair of source/drain regions S/D formed with a prescribed distance away from each other in the surface of the semiconductor substrate 11, and a gate electrode G formed over the region interposed between the pair of the source/drain regions S/D via a gate insulation film GI. The sidewall of the gate electrode G is covered with a sidewall-like sidewall insulation film SI.

Over the transistor TRA, there are formed prescribed wiring layers 16, 25, and 29, coupling members 14, 23, and 27 for electrically coupling the respective wiring layers 16, 25, and 29, and the interlayer insulation films 13, 15, 17, 21, 24, 26, and 28.

Then, the structure of the memory cell will be described in more details.

Figure 3:
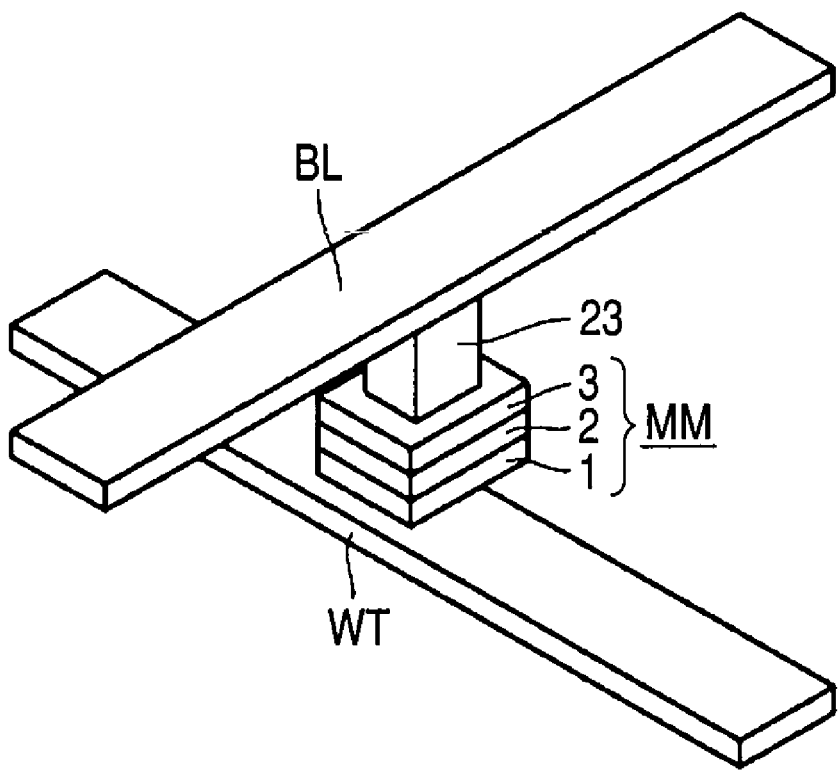
FIG. 3 is a perspective view schematically showing the configuration of the vicinity of a magnetic memory element.
Figure 4:
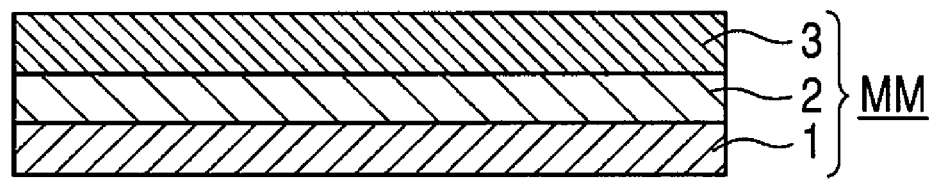
FIG. 4 is a cross sectional view schematically showing the configuration of the magnetic memory element of the magnetic memory device in one embodiment of the present invention.

FIG. 3 is a perspective view schematically showing the configuration of the vicinity of the magnetic memory element in Embodiment 1 in the present invention. FIG. 4 is a cross sectional view schematically showing the configuration of the magnetic memory element in Embodiment 1 of the present invention. Referring to FIGS. 3 and 4, the magnetic memory element MM to be magnetized for information is arranged in such a manner as to be at least partially interposed from the upper and lower directions by the write line WT and the bit line BL in a region in which the write line WT and the bit line BL (the first wire and the second wire) cross each other with a space provided therebetween. The magnetic memory element MM is formed in a lamination structure of, for example, the pinned layer 1, the tunnel insulation layer 2, and the recording layer 3. In the pinned layer 1, the direction of magnetization is fixed. Further, in the recording layer 3, the magnetization direction is changed by the magnetic field generated by the electric current flowing through a prescribed wire (e.g., the bit line BL), or injection of spin polarized electrons.

The pinned layer 1 of the magnetic memory element MM is electrically coupled to the drain region D of the element selection transistor TR via the electrically conductive layer 19 and the coupling members 18, 16, and 14 as shown in FIG. 2. On the other hand, the recording layer 3 side of the magnetic memory element MM is electrically coupled to the bit line BL via the coupling member 23.

As for the recording layer 3 in which the orientation of magnetization is changed by the synthetic magnetic field of the magnetic field by the first wire and the magnetic field by the second wire, generally, there is a direction in which magnetization tends to occur according to the crystal structure, shape, or the like. In this direction, a low energy state occurs. The direction in which magnetization tends to occur is referred to as Ea: easy-axis. In contrast, the direction in which magnetization is less likely to occur is referred to as Ha: Hard axis.

Figure 5:
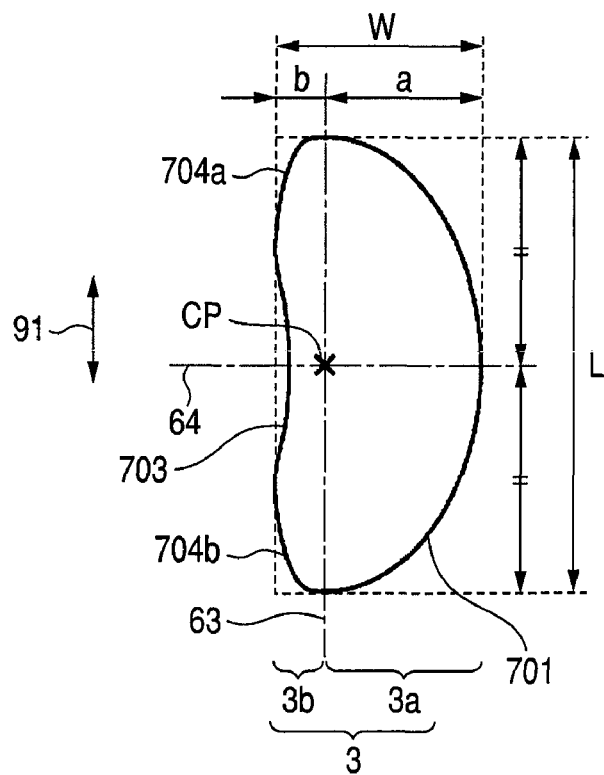
FIG. 5 is a plan view schematically showing the planar shape of a recording layer of the magnetic memory device in one embodiment of the present invention.

FIG. 5 is a plan view schematically showing the planar shape of the recording layer of the magnetic memory device in Embodiment 1 of the present invention.

Referring to FIG. 5, the outline of the planar shape of the recording layer 3 will be described first.

As shown in the figure, the recording layer 3 has a planar shape. In the planar shape, the recording layer 3 has the maximum length L in the direction of easy-axis over a first straight line 63 (primary straight line) along an easy-axis 91.

The recording layer 3 is present over the entire length L over the first straight line 63. Further, the recording layer 3 is situated over a length W smaller than the half of the maximum length L, in the direction perpendicular to the easy-axis 91, that is, in the direction of hard-axis.

Further, the recording layer 3 has a first part 3a and a second part 3b on the one side (on the right hand side in the figure) and on the other side (on the left hand side in the figure) of the first straight line 63, respectively. The first part 3a is situated over a length a in the direction perpendicular to the easy-axis 91. The second part 3b is situated over a length b in the direction perpendicular to the easy-axis. The length b is smaller than the length a. The outer edge of the first part 3a includes only a smooth curve concave outwardly of the outer edge. Incidentally, the term "outer edge of the first part 3a" denotes a portion included in the first part 3a of the outer edge of the recording layer 3.

Namely, the first straight line 63 extends to the position at which the length of the recording layer 3 in the direction of the easy-axis 91 is maximum. Thus, the recording layer 3 has a length L over the first straight line 63. The second straight line 64 is a straight line perpendicular to the first straight line 63, and is situated so as to equally divide the portion of the length L of the first straight line 63. The crossing position CP is the point of intersection between the first straight line 63 and the second straight line 64. The existing region of the recording layer 3 in the direction of extension of the second straight line 64 is the length: W=a+b.

Preferably, the first part 3a has the second straight line 64 as its symmetry axis.

Then, the planar shape of the recording layer 3 will be described in more details, inclusive of specific examples.

The outer edge of the first part 3a of the recording layer 3 includes only a smooth curve convex outwardly of the outer edge. Namely, the outer edge of the first part 3a does not have portions to be the corner, the straight line portion, and the concave portion.

For the curve, a quadratic curve can be used. Namely, the curve expressed as the following equation can be used.

$$ax^2+2hxy+by^2+2fx+2gy+c=0$$

where the y direction is a direction along the direction of easy-axis, and a, h, b, f, g, and c are coefficients.

More specifically, as the curve, for example, there can be used one curve when an ellipse has been divided into two pieces along the major axis. The recording layer 3 shown in FIG. 5 shows the case using such a curve. Namely, the first part 3a includes a circular arc 701 which is a part of the circumference of the ellipse having a major axis with a length L and a minor axis with a length 2a, where L/2>a>b.

The second part 3b has curve portions 703, 704a, and 704b. The curve portion 703 is formed in a concave portion in the edge of the planar shape. The curve portions 703a and 704b have the same curvature. The curve portion 703 is coupled at its upper and lower ends to respective one sides of the curve portions 704a and 704b. The respective other sides of the curve portions 704a and 704b are coupled to the circular arc 701. The curve portion 703 does not have a point of intersection with the first straight line 63.

Herein, there is shown the example in which the curve portions 704a and 704b have the same curvature. However, the curvatures are not necessarily required to be the same. Namely, the second part 3b may have asymmetry with respect to the second straight line 64.

Incidentally, in this embodiment, the pinned layer 1 and the tunnel insulation layer 2 also have the planar shape shown in FIG. 5. However, the present invention is not particularly limited to this embodiment. For example, the following shape is also acceptable: only the recording layer 3 is formed in such a manner as to have a curve portion; and the pinned layer 1 and the tunnel insulation layer 2 are formed so that the planar shape is a rectangle, and further are formed so as to be larger than the recording layer 3 in a plan view. Namely, the tunnel insulation layer 2 and the pinned layer 1 may have the same planar shape as that of the recording layer 3. Alternatively, they may have a given planar shape having a larger area than that of the recording layer 3, inclusive of the planar shape of the recording layer 3.

Figure 6:
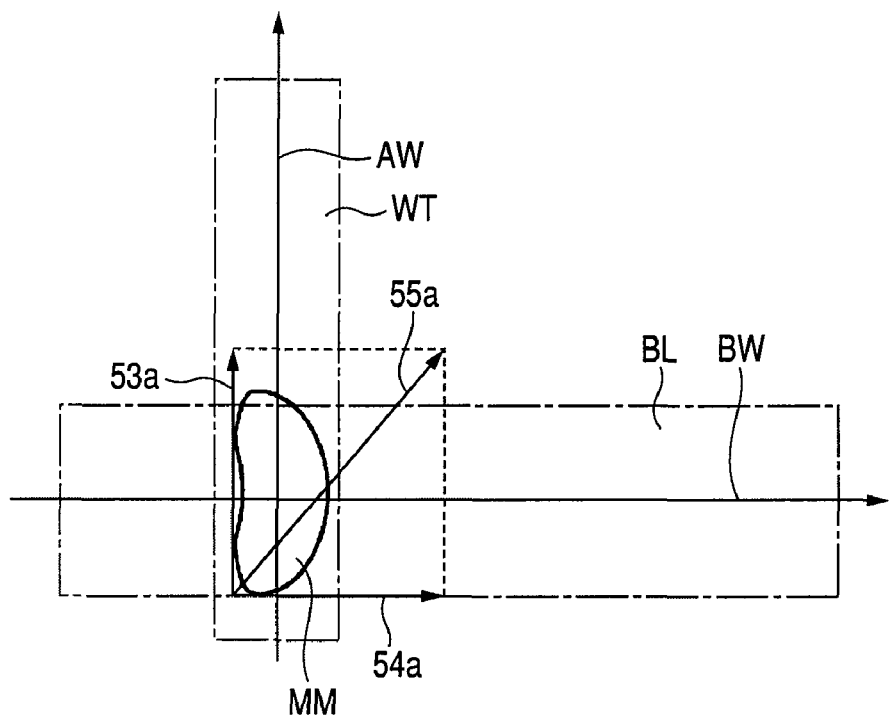
FIG. 6 is an explanatory view of the position of the magnetic memory element in one embodiment of the present invention, and a perspective plan view of the magnetic memory element.
Figure 7:
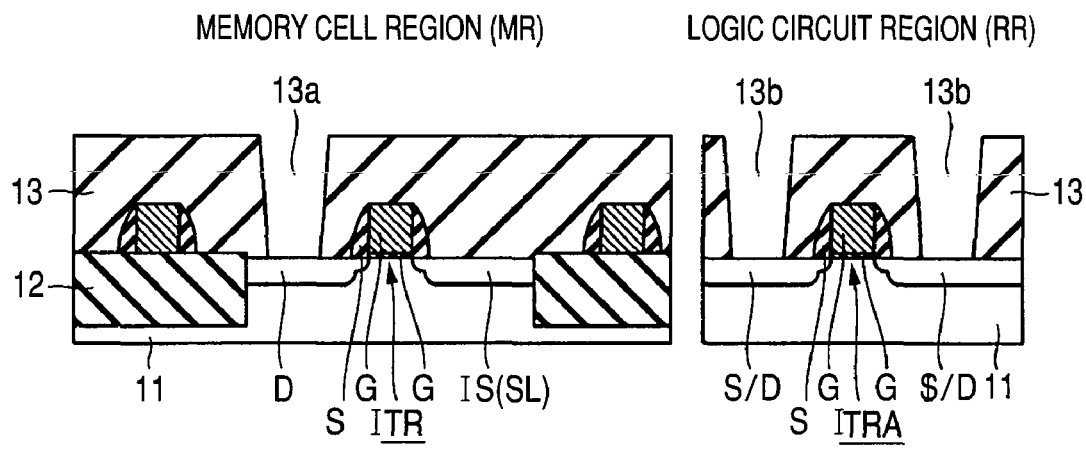
FIG. 7 is a schematic cross sectional view showing a first step of the manufacturing method of the magnetic memory device in one embodiment of the present invention.

FIG. 6 is an explanatory view of the position of the magnetic memory element MM in Embodiment 1 of the present invention, and a perspective plan view of the magnetic memory element MM. Mainly referring to FIG. 6, with the first axis AW as the central axis, the write line WT has a portion extending along the axis. With the second axis BW as the central axis, the bit line BL has a portion extending along the axis. The magnetic memory element MM is arranged so that the easy-axis 91 (FIG. 5) is roughly parallel with the first axis AW. Namely, the magnetic memory element MM is arranged so that the longitudinal direction is roughly parallel with the direction of extension of the write line WT. Whereas, the magnetic memory element MM is arranged so that the direction of hard-axis of the magnetic memory element MM is roughly parallel with the second axis BW. In this embodiment, the write line WT and the bit line BL are formed so that their respective directions of extension are roughly perpendicular to each other.

(Operation of Memory Cell)

Then, the operation of a memory cell will be described.

Referring to FIG. 2, the read operation is performed in the following manner. A prescribed electric current is made to flow through the magnetic memory element MM of a specific memory cell. Thus, the difference in resistance value due to the orientation of magnetization is detected. First, the selection transistor TR of a specific memory cell is set in ON state. Thus, a prescribed sense signal is transferred from the bit line BL through the specific magnetic memory element MM to the source line SL via the coupling members 18, 16, and 14, and the selection transistor TR.

At this step, when the orientations of magnetization of the recording layer 3 and the pinned layer 1 in the magnetic memory element MM are the same orientation (parallel), the resistance value is relatively low. When the orientations of magnetization of the recording layer 3 and the pinned layer 1 are opposite to each other (anti-parallel), the resistance value is relatively high. The tunneling magnetoresistive effect element has the following characteristics: when respective magnetization directions of the recording layer 3 and the pinned layer 1 are parallel with each other, the resistance value becomes small; and when respective magnetization directions of the recording layer 3 and the pinned layer 1 are anti-parallel with each other, the resistance value becomes large.

As a result, when the orientations of magnetization of the magnetic memory element MM are parallel with each other, the intensity of the sense signal flowing through the source line SL is larger than the signal intensity of a prescribed reference memory cell. On the other hand, when the orientations of magnetization of the magnetic memory element MM are anti-parallel with each other, the intensity of the sense signal is smaller than the signal intensity of a prescribed reference memory cell. Thus, whether the information written in a specific memory cell is "0" or "1" is judged based on whether the intensity of the sense signal is larger or smaller than the signal intensity of the prescribed reference memory cell.

The write (rewrite) operation is performed in the following manner. A prescribed electric current is made to flow through the bit line BL and the write line WT, thereby to magnetize (cause magnetization reversal in) the magnetic memory element MM. First, a prescribed electric current is made to flow through the selected bit line BL and write line WT. This generates respective magnetic fields (arrows 53a and 54a of FIG. 6) corresponding to the directions of flows of the electric current around the bit line BL and the write line WT. Resultingly, a synthetic magnetic filed (arrow 55a of FIG. 6) of the magnetic field generated by the electric current flowing through the bit line BL and the magnetic field generated by the electric current flowing through the write line WT acts on the magnetic memory element MM situated in the region in which the selected bit line BL and write line WT cross each other.

At this step, there are an embodiment in which the recording layer 3 of the magnetic memory element MM is magnetized in the same orientation as the orientation of magnetization of the pinned layer 1; and an embodiment in which the recording layer 3 is magnetized in the opposite orientation to the orientation of magnetization of the pinned layer 1. In this manner, the case where the orientations of magnetization of the recording layer 3 and the pinned layer 1 are the same orientation (parallel), and the case of the opposite orientations (anti-parallel) are implemented. Thus, the orientation of magnetization is recorded as information corresponding to "0" or "1".

(Manufacturing Method of Magnetic Memory Device)

Then, a description will be given to one example of the manufacturing method of the magnetic memory element and the magnetic memory device.

FIGS. 7 to 11 are schematic cross sectional views showing the manufacturing method of the magnetic memory device in Embodiment 1 of the present invention step by step. First, by reference to FIG. 7, the element isolation insulation film 12 is formed in a prescribed region in the main surface of the semiconductor substrate 11. As a result, the memory cell region MR and the peripheral circuit region RR are formed. Over the surface of the semiconductor substrate 11 situated in the memory cell region MR and the peripheral circuit region RR, the gate electrode main body G is formed via the gate insulation film GI. By using the gate electrode main body G, and the like as a mask, impurities of a prescribed conductivity type are introduced into the surface of the semiconductor substrate 11. As a result, the drain region D and the source region S comprised of an impurity region, and a pair of source/drain regions S/D are formed. Thus, in the memory cell region MR, the element selection transistor TR including the gate electrode G, and the drain region D and the source region S is formed. In the peripheral circuit region RR, the transistor TRA forming the logic circuit is formed.

The interlayer insulation film 13 is formed by, for example, a CVD (Chemical Vapor Deposition) method in such a manner as to cover the element selection transistor TR and the transistor TRA. The interlayer insulation film 13 is subjected to a prescribed photomechanical process and etching, thereby to form contact holes 13a and 13b exposing the surface of the semiconductor substrate 11. For example, a tungsten layer (not shown) is formed over the interlayer insulation film 13 in such a manner as to fill the contact holes 13a and 13b. The tungsten layer is subjected to a CMP (Chemical Mechanical Polishing) processing. As a result, the portion of the tungsten layer situated over the top side of the interlayer insulation film 13 is removed.

Figure 8:
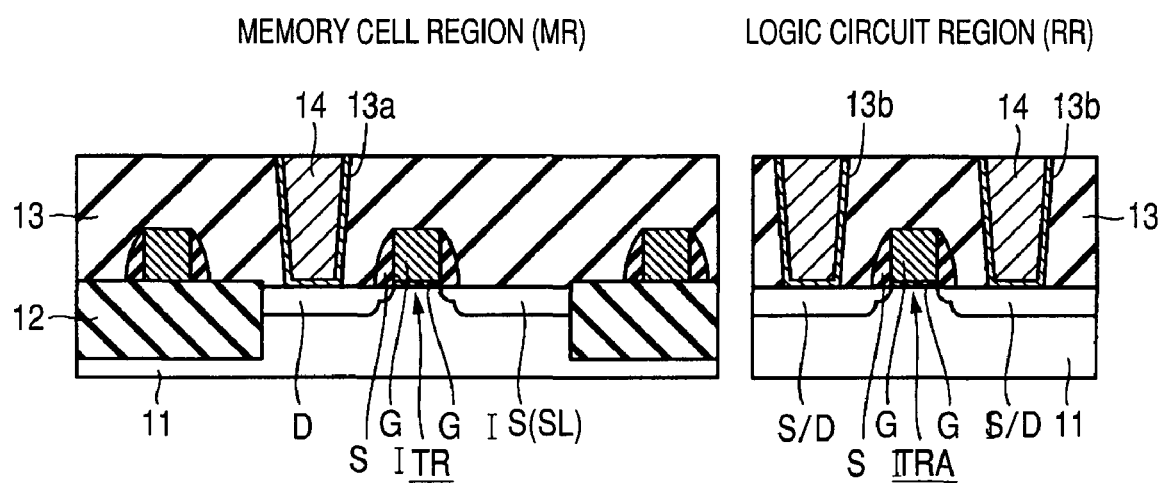
FIG. 8 is a schematic cross sectional view showing a second step of the manufacturing method of the magnetic memory device in one embodiment of the present invention.

Referring to FIG. 8, by the removal of the tungsten layer, the tungsten layer is left in each of the contact holes 13a and 13b to form a coupling member 14.

Figure 9:
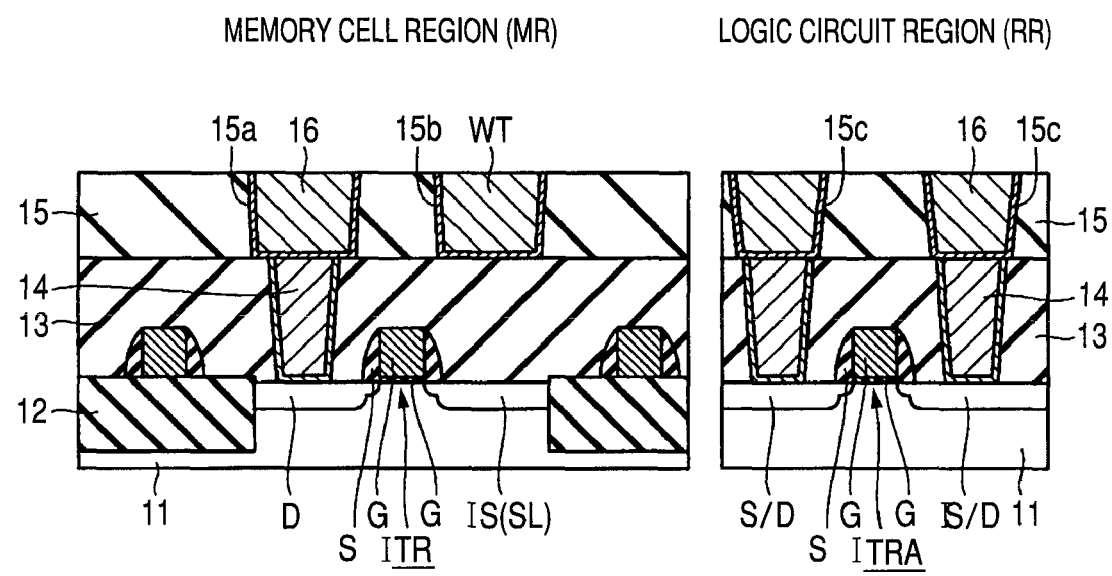
FIG. 9 is a schematic cross sectional view showing a third step of the manufacturing method of the magnetic memory device in one embodiment of the present invention.

Referring to FIG. 9, the interlayer insulation film 15 is further formed over the interlayer insulation film 13 by, for example, a CVD method. The interlayer insulation film 15 is subjected to a prescribed photomechanical process and etching. As a result, in the memory cell region MR, openings 15a and 15b for forming a write line and a prescribed wiring layer are formed. Whereas, in the peripheral circuit region RR, an opening 15c for forming a prescribed wiring layer is formed in the interlayer insulation film 15. For example, a copper layer (not shown) is formed over the interlayer insulation film 15 in such a manner as to fill the openings 15a, 15b, and 15c. The copper layer is subjected to a CMP processing, so that the copper layer situated over the top side of the interlayer insulation film 15 is removed. As a result, the copper layer is left in the openings 15a, 15b, and 15c. Accordingly, in the memory cell region MR, a write line WT is formed in the opening 15a, and a wiring layer 16 is formed in the opening 15b. Whereas, in the peripheral circuit region RR, the wiring layer 16 is formed in the opening 15c.

Incidentally, for the formation of the copper layer to fill the openings 15a, 15b, and 15c, a reaction preventive layer for preventing the reaction between the copper layer and the interlayer insulation layer may be stacked. Further, for the formation of the write line WT, the copper layer may be laminated with a high magnetic permeability film in order to concentrate the wiring current magnetic field to the magnetic memory element.

Figure 10B:
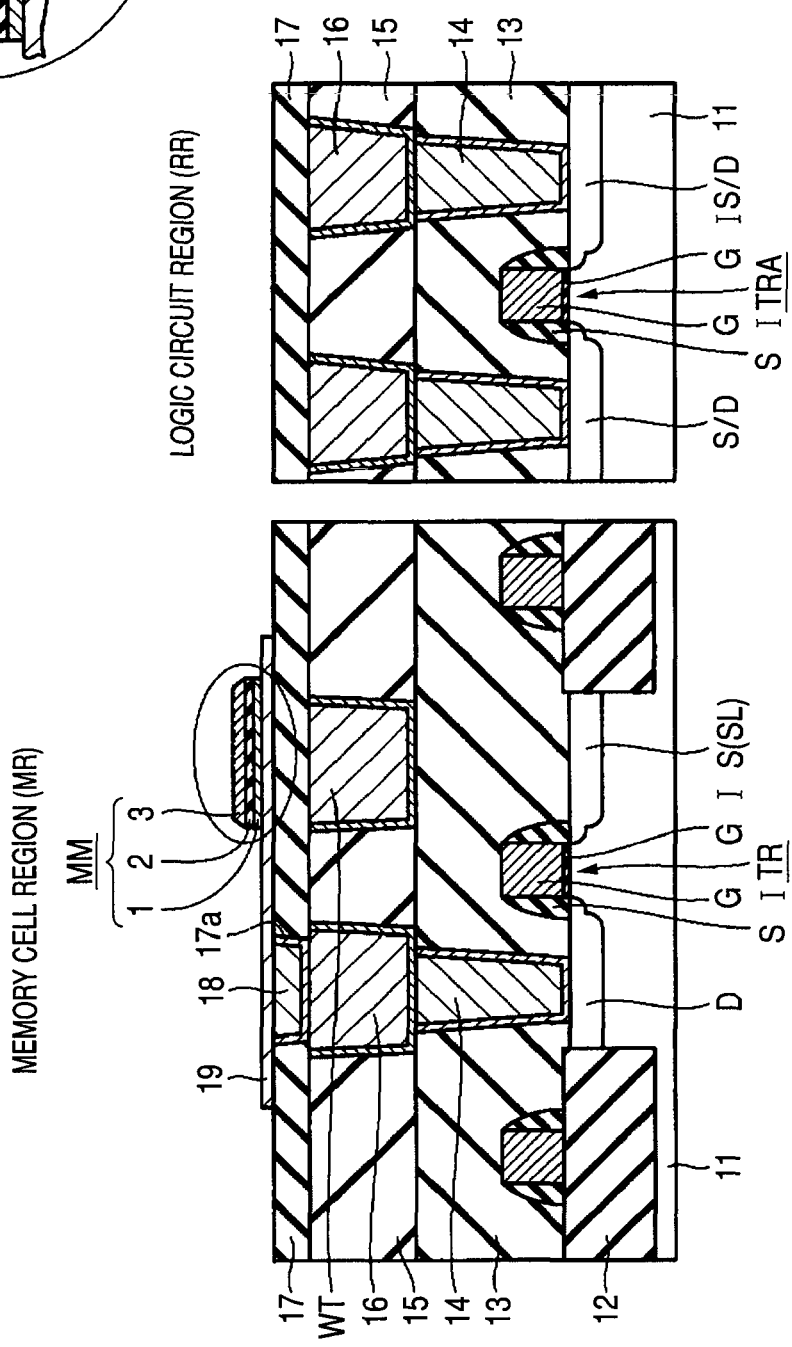
FIG. 10(b) is an enlarged cross sectional view showing the magnetic memory element portion on an enlarged scale.
Figure 10B:
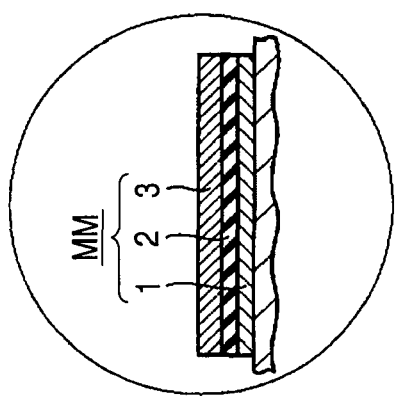

Referring to FIGS. 10(a) and 10(b), the interlayer insulation film 17 is further formed over the interlayer insulation film 15 by, for example, a CVD method. The interlayer insulation film 17 is subjected to a prescribed photomechanical process and etching. As a result, a contact hole 17a exposing the surface of the wiring layer 16 is formed. For example, a copper layer (not shown) is formed over the interlayer insulation film 17 in such a manner as to fill the inside of the contact hole 17a. The copper layer is subjected to, for example, a CMP processing, so that the copper layer situated over the top side of the interlayer insulation film 17 is removed. As a result, the copper layer is left in the contact hole 17a, thereby to form the coupling member 18.

Then, over the interlayer insulation film 17 in the memory cell region MR, the electrically conductive layer 19 and the magnetic memory element MM are formed. The magnetic memory element MM includes a lamination film of the pinned layer 1, the tunnel insulation layer 2, and the recording layer 3. First, as a film to be the pinned layer 1, for example, a platinum manganese film (antiferromagnetic layer) with a film thickness of about 20 nm, and a cobalt alloy film (ferromagnetic film) with a film thickness of about 3 nm are successively formed. Subsequently, as a film to be the tunnel insulation layer 2, for example, an aluminum oxide film with a film thickness of about 1 nm is formed. Then, as the recording layer 3, for example, a nickel alloy film with a film thickness of about 3 nm is formed (both are not shown). Incidentally, the platinum manganese film, the cobalt alloy film, the aluminum oxide film, and the nickel alloy film are formed by, for example, a sputtering method.

Thereafter, the nickel alloy film, the aluminum oxide film, the cobalt alloy film, and the platinum manganese film are subjected to prescribed photomechanical process and etching. This results in the formation of a magnetic memory element MM in a prescribed shape including the pinned layer 1, the tunnel insulation layer 2, and the recording layer 3. Generally, when a dry process (ashing) is used for removal of a resist pattern after etching, a gas containing oxygen as a main component is used. Preferably, gases not oxidative with respect to the constituent materials of the pinned layer 1 and the recording layer 3, such as hydrogen, nitrogen, and ammonia, and their mixture gases are used. Accordingly, oxidation of the pinned layer 1 and the recording layer 3 are prevented.

Incidentally, the pinned layer 1 may be in a lamination structure of antiferromagnetic layer/ferromagnetic layer/non-magnetic layer/ferromagnetic layer. Whereas, it doesn't matter if the recording layer 3 is formed in a lamination of ferromagnetic films having different magnetic characteristics, or in a lamination structure of ferromagnetic layer/non-magnetic layer/ferromagnetic layer.

Figure 11:
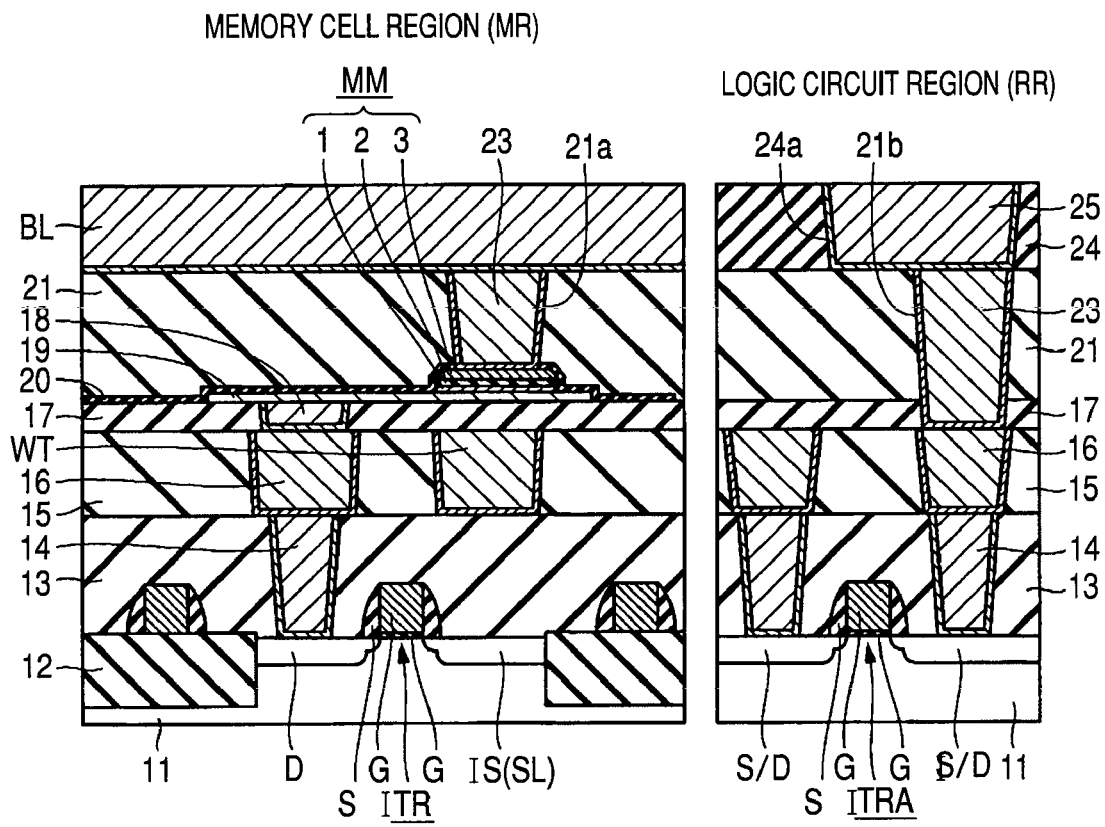
FIG. 11 is a schematic cross sectional view showing a fifth step of the manufacturing method of the magnetic memory device in one embodiment of the present invention.

Referring to FIG. 11, in order to prevent the magnetic memory element MM from being damaged by the subsequent process, the protective film 20 is formed in such a manner as to cover the magnetic memory element MM. Further, the interlayer insulation film 21 is formed over the interlayer insulation film 17 by, for example, a CVD method in such a manner as to cover the protective film 20. In the memory cell region MR, the interlayer insulation film 21 and the protective film 20 are subjected to a prescribed photomechanical process and etching, thereby to form a contact hole 21a exposing the surface of the recording layer 3. Whereas, in the peripheral circuit region RR, the interlayer insulation film 21 and the interlayer insulation film 17 are subjected to a prescribed photomechanical process and etching, thereby to form a contact hole 21b reaching the surface of the wiring layer 16. A copper layer (not shown) is formed over the interlayer insulation film 21 in such a manner as to fill the insides of the contact holes 21a and 21b. The copper layer is subjected to, for example, a CMP processing, thereby to remove the copper layer situated over the top side of the interlayer insulation film 21. As a result, the copper layer is left in each inside of the contact holes 21a and 21b to form the coupling member 23.

The interlayer insulation film 24 is further formed over the interlayer insulation film 21 by, for example, a CVD method in such a manner as to cover the interlayer insulation film 21. The interlayer insulation film 24 is subjected to prescribed photomechanical process and etching. As a result, in the memory cell region MR, an opening for forming the bit line is formed in the interlayer insulation film 24. In the peripheral circuit region RR, an opening 24a is formed in the interlayer insulation film 24. For example, a copper layer (not shown) is formed over the interlayer insulation film 24 in such a manner as to fill the insides of the openings. The copper layer is subjected to, for example, a CMP processing, thereby to remove the copper layer situated over the top side of the interlayer insulation film 24. As a result, in the opening for the bit line, the copper layer is left to form the bit line BL. Whereas, in the opening 24a, the copper layer is left to form the wiring layer 25.

Incidentally, in the foregoing description, the single damascene method was described. However, the following procedure is also acceptable. After the formation of the interlayer insulation film 21, further, the interlayer insulation film 24 is formed. In the interlayer insulation films 21 and 24, prescribed coupling member and wiring layer are formed with a dual damascene method. In this case, first, the interlayer insulation film 24 is subjected to prescribed photomechanical process and etching. As a result, in the memory cell region MR, an opening (not shown) for forming the bit line is formed. In the peripheral circuit region RR, an opening 24a for forming the wiring layer is formed. Then, the interlayer insulation film 21 is subjected to prescribed photomechanical process and etching. As a result, in the memory cell region MR, a contact hole 21a reaching the surface of the magnetic memory element MM is formed in the interlayer insulation film 21. In the peripheral circuit region RR, the contact hole 21b reaching the surface of the wiring layer 16 is formed. Incidentally, it is also acceptable that the opening 24a and the like are formed in the interlayer insulation film 24a after the formation of the contact holes in the interlayer insulation films 21 and 24.

Then, for example, a copper layer (not shown) is formed over the interlayer insulation film 24 in such a manner as to fill the insides of the contact holes 21a and 21b, and the openings 24a, and the like. The copper layer is subjected to, for example, a CMP processing, thereby to remove the portion of the copper layer situated over the top side of the interlayer insulation film 24. As a result, in the memory cell region MR, the coupling member 23 embedded in the contact hole 21a, to be electrically coupled to the recording layer 3 is formed. In addition, in the opening, the bit line BL to be electrically coupled to the coupling member 23 is formed. Incidentally, even when the coupling member 23 is not used, there is no problem so long as the bit line BL and the recording layer 3 can be electrically coupled. On the other hand, in the peripheral circuit region RR, in the contact hole 21b, the coupling member 23 to be electrically coupled to the wiring layer 16 is formed. In addition, in the opening 24a, the wiring layer 25 to be electrically coupled to the coupling member 23 is formed.

Referring to FIG. 2, the interlayer insulation film 26 is further formed over the interlayer insulation film 24 in such a manner as to cover the bit line BL and the wiring layer 25 formed in the foregoing description. In the peripheral circuit region RR, a hole is formed in the interlayer insulation film 26, and the coupling member 27 is formed in the hole. Over the interlayer insulation film 26, the interlayer insulation film 28 is further formed. An opening is formed in the interlayer insulation film 28, and the wiring layer 29 is formed in the opening.

Incidentally, in the foregoing description, the single damascene method was described. However, the following procedure is also acceptable. After the formation of the interlayer insulation film 26, the interlayer insulation film 28 is further formed. In the interlayer insulation films 26 and 28, the coupling member 27 and the wiring layer 29 are formed by the dual damascene method in the same manner as described above.

By the steps up to this point, the magnetic memory device of this embodiment is manufactured.

Incidentally, with the manufacturing method of the magnetic memory device, a description was given by taking the tungsten layer as an example of the coupling member 14 or the like. However, for example, silicon may be applied thereto. Alternatively, a metal such as copper, titanium, or tantalum may also be applied thereto. Further, alloys of such metals, nitrides of such metals, and the like can also be applied thereto. Whereas, a description was given by taking the CMP method or the RIE method as an example of the method of forming the coupling member 14, or the like. However, for example, a plating method, a sputtering method, or a CVD method may be applied thereto. When copper is applied as a metal, a so-called damascene method can be applied thereto. Thus, the wiring layer can also be formed in parallel with the coupling member 14.

Further, a description was given by taking the single damascene method as an example of the method of forming the write line WT. However, when the write line WT is formed simultaneously with the coupling member 14, the dual damascene method can be applied thereto. Further, by applying a metal such as silicon, tungsten, aluminum, or titanium, an alloy of such a metal, or a compound of such a metal as the wiring material, the formation of wiring by dry etching also becomes possible.

The film thickness of the interlayer insulation film lying between the wiring layer and the wiring layer varies according to the application device. However, with the magnetic memory device, the film thickness is, for example, about 40 nm.

Whereas, a description was given by taking an aluminum oxide as an example for the tunnel insulation layer 2 of the magnetic memory element MM. However, as the tunnel insulation layer 2, a non-magnetic material is preferable. For example, an oxide of a metal such as aluminum, silicon, tantalum, or magnesium, a nitride of the metal, an alloy oxide of the metal typified by silicate, or a nitride of the alloy is preferable as the tunnel insulation layer 2. Further, the tunnel insulation layer 2 is preferably formed as a relatively thin film with a film thickness of about 0.3 to 5 nm. Incidentally, when a non-magnetic metal material is used in place of the tunnel insulation layer 2, it is also possible to use a so-called giant magnetoresistive effect in the direction perpendicular to the film plane.

Further, as the pinned layer 1 of the magnetic memory element MM, the lamination structure of the platinum manganese alloy film and the cobalt iron alloy film was taken as an example. Whereas, as the recording layer 3, the nickel iron alloy film was taken as an example. However, for the pinned layer 1 and the recording layer 3, for example, a ferromagnetic material containing nickel, iron, and/or cobalt as a main component is preferable. Further, for the improvement of the magnetic characteristics and the thermal stability of the ferromagnetic material, additives such as boron, nitrogen, silicon, and molybdenum may be introduced into the ferromagnetic material. Particularly, for the recording layer 3, the improvement/stabilization of the magnetic characteristics thereof can also be achieved by the following and other methods. Over the recording layer 3, a crystalline material thin film having a crystal structure of body-centered cubic type, rutile type, sodium chloride type, or zincblende type for improving the magnetic characteristics of the recording layer 3 is stacked; and/or an oxidation preventive film of tantalum, ruthenium, or the like is stacked. Further, it is also possible to apply NiMnSb, $Co_2Mn(Ge, Si)$, $Co_2Fe(Al, Si)$, $(Zn, Mn)Fe_2O_4$, or the like, which is referred to as a half-metal. In the half-metal, an energy gap exists in one spin band, which can provide very large magnetic effects. As a result, a large signal output can be obtained.

The pinned layer 1 is formed in a lamination structure of the antiferromagnetic layer and the ferromagnetic layer. As a result, the magnetization direction thereof can be more fixed. In other words, the antiferromagnetic layer fixes the orientation of the spin of the ferromagnetic layer, so that the direction of magnetization of the ferromagnetic layer is kept constant. For the antiferromagnetic layer, a compound of at least one of a ferromagnetic material such as iron or noble metals, and manganese is preferable.

Incidentally, with the manufacturing method, the case where the pinned layer 1, the tunnel insulation layer 2, and the recording layer 3 which form the magnetic memory element are respectively formed by a sputtering method was taken as an example. However, it is also possible to respectively form the pinned layer 1, the tunnel insulation layer 2, and the recording layer 3 by, for example, a MBE (Molecular Beam Epitaxy) method, a chemical vapor growth method, or a vapor deposition method, other than the sputtering method.

Further, with the manufacturing method of the magnetic memory device, a description was given to the case where the electrically conductive layer 19 is present between the pinned layer 1 of the magnetic memory element MM and the coupling member 18. However, the pinned layer 1 and the coupling member 18 may also be directly coupled to each other. Alternatively, it is also acceptable that the wiring layer 16 and the electrically conductive layer 19 are directly coupled to each other without the coupling member 18 therebetween. In this case, the electrically conductive layer 19 may be formed in the same shape as the planar shape of the pinned layer 1 so as to overlap the pinned layer 1 in a plan view. As the material for the electrically conductive layer 19, a low resistance metal such as platinum, ruthenium, copper, aluminum, or tantalum is preferably applied. Whereas, the film thickness of the electrically conductive layer 19 is preferably set at, for example, 300 nm or less in order to prevent the impairment of the flatness of the pinned layer 1, the tunnel insulation layer 2, and the recording layer 3 to be formed over the electrically conductive layer.

Incidentally, when the pinned layer 1 and the recording layer 3 are formed with the same size in a plan view, the electrically conductive layer 19 is required to be formed larger, in a plan view, than the pinned layer 1 so that the electrically conductive layer 19 is coupled to the coupling member 14. Even when the electrically conductive layer 19 is formed larger two-dimensionally than the pinned layer 1, the resulting magnetic memory device does not have any problems as the magnetic memory element.

Thus, a prescribed electrically conductive layer 19 is allowed to exist between the interlayer insulation film 15 and the magnetic memory element MM. As a result, when the coupling member 18 is formed of, for example, copper, the coupling member 18 of copper can also be prevented from being corroded during patterning of the magnetic memory element MM by etching. Further, to the electrically conductive layer 19, a material having a lower resistance than the resistance of the pinned layer 1 of the magnetic memory element MM is applied. This can reduce the resistance of the path of an electric current for reading, which can also attain improvement of the reading speed.

Whereas, further, with the magnetic memory device of this embodiment, the following case was taken as an example, and was described. In order to prevent the magnetic memory element MM from being damaged in the steps after the formation of the magnetic memory element MM, the protective film 20 is formed in such a manner as to cover the magnetic memory element MM. Examples of the damage which the magnetic memory element MM may suffer during the manufacturing steps include the damage by the heat treatment for forming the interlayer insulation film. When a silicon oxide film is formed as the interlayer insulation film, the silicon oxide film is formed under an oxidizing atmosphere at about 400° C.

At this step, the magnetic film may be oxidized under the oxidizing atmosphere. As a result, the magnetic characteristics of the magnetic memory element MM may be deteriorated. By covering the magnetic memory element MM with the protective film 20 such as a silicon nitride film or an aluminum oxide film, the protective film 20 can protect the magnetic memory element MM as the barrier against the oxidation.

Whereas, in order to prevent such oxidation, the interlayer insulation film may be configured in a two-layer structure of a thin film depositable under a non-oxidizing atmosphere such as a silicon nitride film, and an oxidizing insulation film. In this case, of the two-layer structure interlayer insulation film, the silicon nitride film serves as the protective film of the magnetic memory element MM.

Further, the protective film 20 is preferably a film containing at least one material of an insulating metal nitride, an insulating metal carbide, and a metal oxide formed by the oxidation treatment of a metal having a lower oxide forming free energy than that of Fe. By using such a material, it is possible to prevent the oxidation of the magnetic memory element MM during the oxidation step in the manufacturing steps of the magnetic memory device using a magnetic material thin film containing at least Fe. As a result, it is possible to obtain a magnetic memory device which is easy to manufacture, and is stable in operation characteristics.

(Operation and Effect)

Then, the operation and effect of the magnetic memory device of this embodiment will be described, including the description of Comparative Examples.

Figure 12:
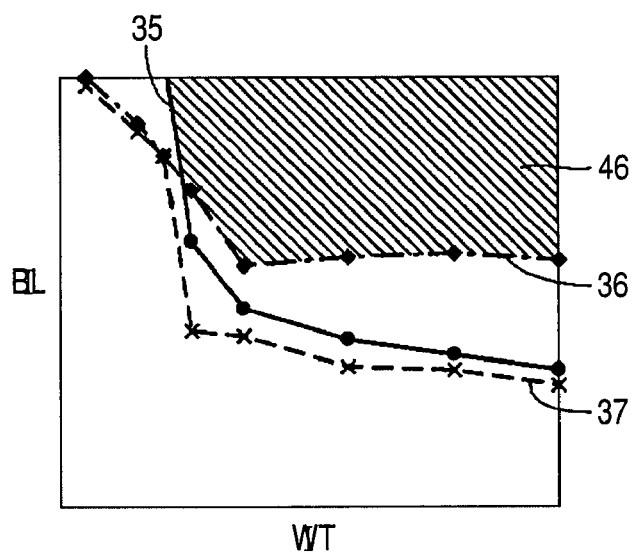
FIG. 12 is a view showing the astroid curve of a magnetic memory device in First Comparative Example.
Figure 13:
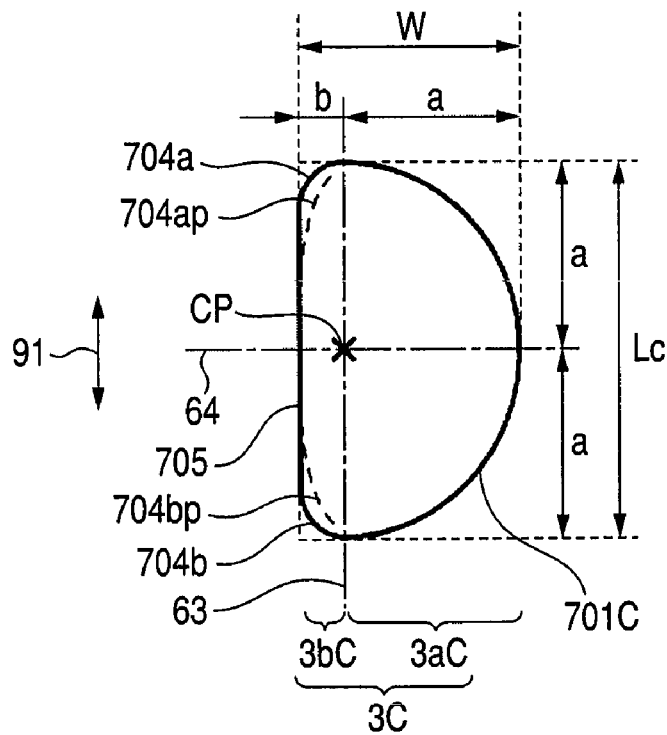
FIG. 13 is a plan view schematically showing the planar shape of the recording layer of the magnetic memory device in First Comparative Example.

First, the write characteristics of the magnetic memory device in Comparative Examples will be described. FIG. 12 is a diagram showing the astroid curve of a magnetic memory device in First Comparative Example. FIG. 13 is a plan view schematically showing the shape in a plan view of the magnetic memory element in First Comparative Example. Incidentally, the lateral axis of FIG. 12 shows the electric current IWT to be made to flow through the write line WT for causing the magnetic field Hx in the direction of hard-axis. The vertical axis shows the electric current IBL to be made to flow through the bit line BL for causing the magnetic field Hy in the direction of easy-axis.

Referring to FIGS. 12 and 13, the recording layer 3C of First Comparative Example has a planar shape. In the planar shape, the recording layer 3C has the maximum length LC in the direction of easy-axis over the first straight line 63 along the easy-axis 91. The recording layer 3C is present over the entire length LC over the first straight line 63. Further, the recording layer 3C is situated over a length W larger than the length a of the half of the maximum length LC in the direction perpendicular to the easy-axis 91, i.e., in the direction of hard-axis.

Further, the recording layer 3C has a first part 3aC and a second part 3bC on the one side (on the right hand side in the figure) and on the other side (on the left hand side in the figure) of the first straight line 63, respectively. The first part 3aC is situated over the length a in the direction perpendicular to the easy-axis 91. The second part 3bC is situated over the length b in the direction perpendicular to the easy-axis. The length b is smaller than the length a. The outer edge of the first part 3aC includes only a smooth curve concave outwardly of the outer edge. Incidentally, the term "outer edge of the first part 3aC" denotes a portion included in the first part 3aC of the outer edge of the recording layer 3C.

In the planar shape, the first part 3aC includes a circular arc 701C, where LC/2=a. The second part 3bC has a straight line portion 705. The straight line portion 705 are coupled at its upper and lower ends to respective one sides of the curve portions 704a and 704b having the same curvature. The respective other sides of the curve portions 704a and 704b are coupled to the circular arc 701.

The respective measuring points plotted in the graph (FIG. 12) are results of measurement of the bit line current IBL necessary for reversing the orientation of magnetization by applying a given write line current IWT thereto with the orientation of magnetization of the recording layer 3C being in the negative direction of the magnetic field Hy. Namely, the curves coupling respective plots 35 to 37 denote respective astroid curves of the recording layer 3.

With the shape symmetric with respect to the direction of hard-axis having both the curve portions 704a and 704b shown by a solid line in FIG. 13, the astroid curve in FIG. 12 is indicated with the plot 35. When the recording layer 3C having the shape shown in FIG. 13 is adopted, as described later, in the plot 35, when the write line current IWT is smaller than a given value (which is hereinafter referred to as "hard-axis direction threshold value"), the bit line current IBL necessary for reversal in the direction of easy-axis sharply increases. Namely, only in the region where the write line current IWT is smaller than the hard-axis direction threshold value, a large bit line current becomes necessary for magnetization reversal. Although herein not shown, in this case, even when writing is performed in the opposite direction, for the write current, merely IBL reverses in sign.

Subsequently, in order to consider the case where the shape is asymmetrical with respect to the hard-axis direction, a consideration will be given to the case where the curve portions 704a and 704b are the curve portions 704ap and 704bp, respectively. The shape having only any one of the curve portions 704ap and 704bp results in the astroid curves indicated with plots 36 and 37 in FIG. 12. In this case, when writing is performed in the opposite direction, the write currents are a current obtained by reversing the sign of IBL of 37 for the plot 36, and a current obtained by reversing the sign of IBL of 36 for the plot 37. Namely, even in the same bit, the write current varies according to the direction.

Thus, when the current value necessary for magnetization reversal varies due to the asymmetry in the direction of hard-axis of the shape, with 36 and 37, conceivably, the region where magnetization reversal of the recording layer can be caused (hatching region in the figure) 46 narrows, or writing of information becomes impossible.

Figure 14:
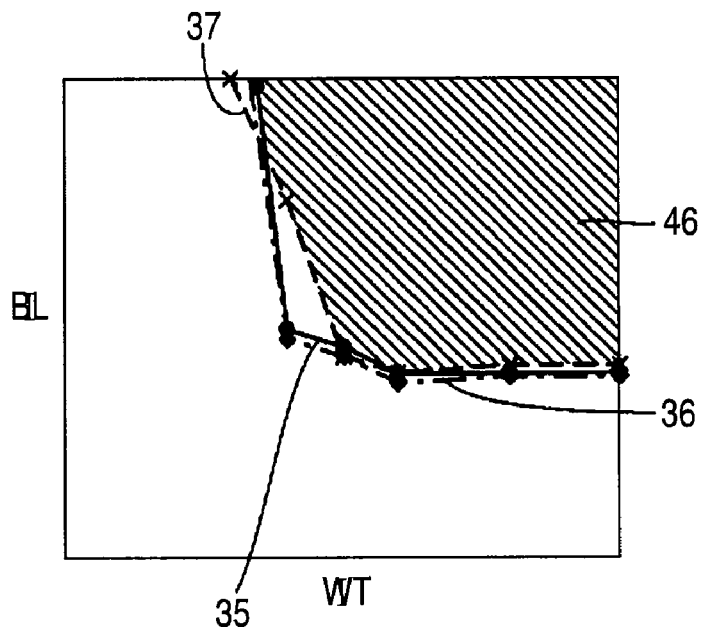
FIG. 14 is a view showing the astroid curve of the magnetic memory device in one embodiment of the present invention.
Figure 15:
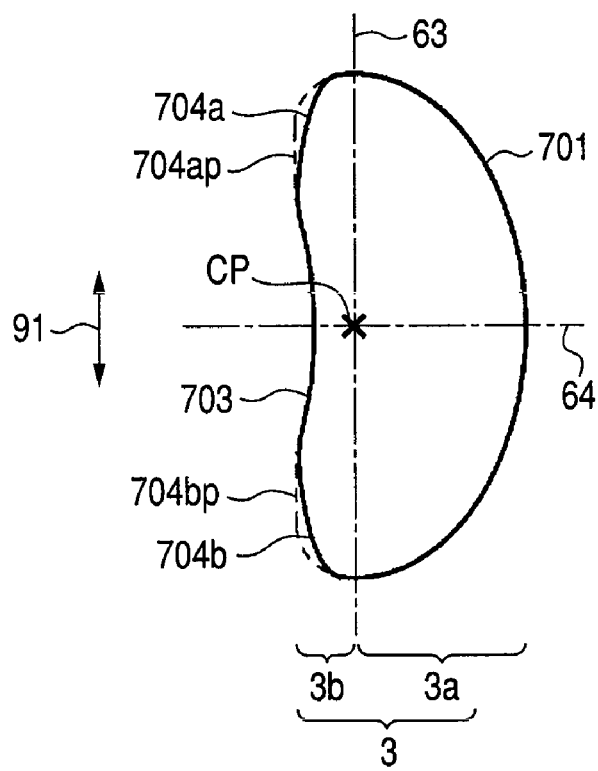
FIG. 15 is a plan view schematically showing the planar shape of the recording layer of the magnetic memory device in one embodiment of the present invention.

Then, a description will be given to the write characteristics of the magnetic memory device in this embodiment. FIG. 14 is a view showing the astroid curve of the magnetic memory device in Embodiment 1 of the present invention. FIG. 15 is a plan view schematically showing the planar shape of the recording layer of the magnetic memory device in Embodiment 1 of the present invention.

Referring to FIGS. 14 and 15, when the planar shape of the recording layer 3 is asymmetric in the direction of hard-axis by each of the curve portions 704ap and 704bp, the astroid curves are like the plots 37 and 36. Incidentally, the plot 35 is a plot of the astroid curve when the recording layer 3 is symmetric in the direction of hard-axis. Herein, the fluctuations of the three curves are apparently smaller than in the case shown in FIG. 12. For example, even when asymmetry is caused in the shape in the direction of hard-axis due to the manufacturing steps, variations in the astroid curve of the recording layer 3 can be prevented. As a result, it is possible to ensure the region 46 where the magnetization reversal of the recording layer can be performed more largely than with First Comparative Example (FIG. 12).

Figure 16:
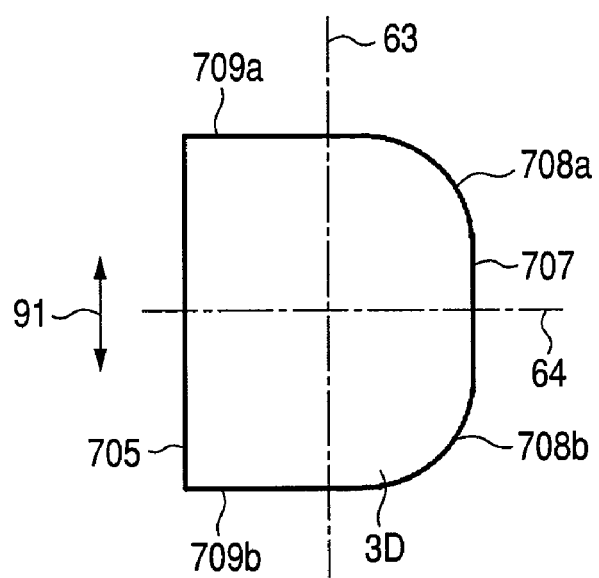
FIG. 16 is a plan view schematically showing the planar shape of the recording layer of a magnetic memory device in Second Comparative Example.

Herein, in order to describe the reason why the foregoing effect can be obtained, Second Comparative Example will be described. FIG. 16 is a plan view schematically showing the planar shape of the recording layer of the magnetic memory device in Second Comparative Example.

Referring to FIG. 16, the recording layer 3D of Second Comparative Example has, in planar shape, linear straight line parts 707 and 705 in the direction of the first straight line 63 (direction of easy-axis), and linear straight line parts 709a and 709b in the direction of the second straight line 64 (direction of axis perpendicular to the easy-axis). The straight line part 705 and the straight line part 709b are formed so as to cross each other at right angles. Whereas, the straight line part 705 and the straight line part 709a are formed so as to cross each other at right angles. In contrast, the straight line part 709a and the straight line part 707 are coupled via the curve part 708a. The straight line part 709b and the straight line part 707 are coupled via the curve part 708b. The straight line part 707 and the straight line part 705 are parallel with each other. Whereas, the straight line part 709a and the straight line part 709b are parallel with each other. The curve part 708a and the curve part 708b are formed so as to be respectively circular arcs. Namely, the planar shape of the recording layer 3 is formed so as to be asymmetric with respect to the easy-axis 63, and to be line symmetric with respect to the hard-axis 64 (axis perpendicular to the easy-axis 63).

Figure 17:
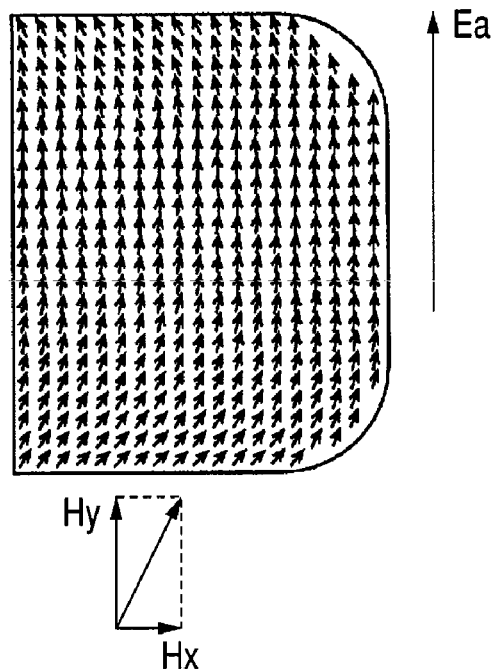
FIG. 17 is a plan view showing the manner of magnetization when the recording layer of FIG. 16 has C type magnetization distribution.
Figure 18:
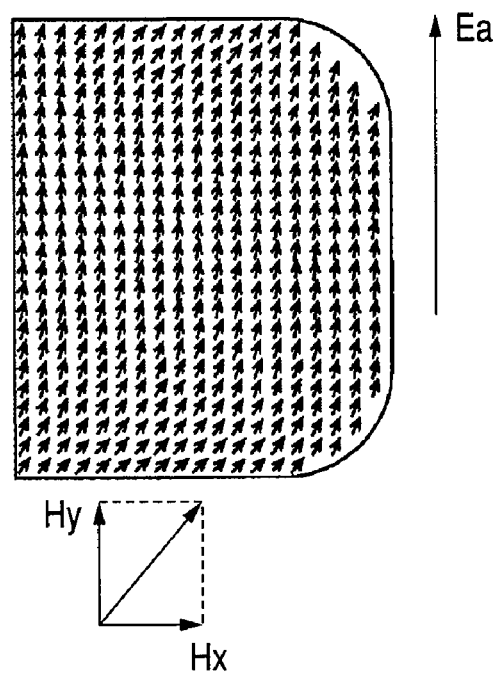
FIG. 18 is a plan view showing the manner of magnetization when the recording layer of FIG. 16 has S type magnetization distribution.

First, as shown in the plot 35 of FIGS. 12 and 14, the phenomenon that the magnitude of the bit line current IBL necessary for magnetization reversal remarkably varies depending upon the magnitude of the write line current IWT in the direction of easy-axis is caused by the difference in magnetization state. FIGS. 17 and 18 show the magnetization distributions in the case where the synthetic magnetic field of the magnetic filed in the direction of easy-axis and the magnetic field in the direction of hard-axis is smaller than the reversing magnetic field, and in the case where the synthetic magnetic field is larger, respectively. Both are plan views of the recording layer of the magnetic memory element in Embodiment 1 of the present invention. Respective arrows in FIGS. 17 and 18 represent the orientations of magnetization at their respective positions. In FIGS. 17 and 18, a magnetic field is applied so that the magnitudes of respective magnetic fields Hy are the same, and the magnitudes of the magnetic fields Hx are different. The magnitude of the magnetic field Hx applied in FIG. 17 is smaller than the hard-axis direction threshold value. The magnitude of the magnetic field Hx applied in FIG. 18 is larger than the hard-axis direction threshold value.

Figure 19A:
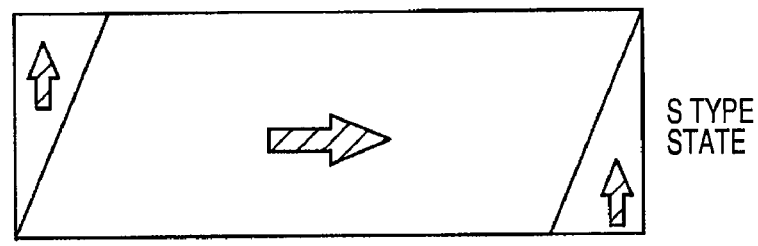
FIG. 19(a) is a conceptual view of the S type magnetization distribution state.
Figure 19B:
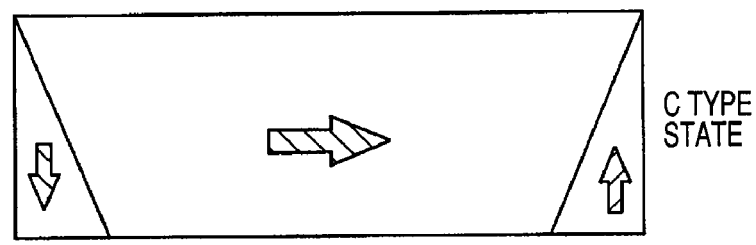
FIG. 19(b) is a conceptual view of the C type magnetization distribution state.

The magnetization distribution state as shown in FIG. 17 is referred to as C type (first magnetization distribution). The state is a stable magnetization state, so that the magnetization reversing magnetic field in the direction of easy-axis becomes larger. In contrast, the magnetization distribution state as shown in FIG. 18 is referred to as S type (second magnetization distribution). The recording layer 3 in this state is susceptible to torque by an external magnetic field, so that the magnetization reversing magnetic field sharply becomes smaller. The conceptual views of the magnetization distribution states of the S type and the C type are shown in FIGS. 19(*a*) and 19(*b*), respectively. The recording layer 3 of this embodiment has a planar shape which enables control of the magnetization distribution states of the S type and the C type by an external magnetic field. The recording layer 3 shown in FIG. 5 also assumes the same magnetization distribution states.

Returning back, as described previously, in the recording layer 3 shown in FIG. 5, the right-hand side portion of the easy-axis 63 includes the circular arc 701. When the MRAM has been highly integrated, it becomes difficult to control the shape with a small curvature due to the photolithography or etching step for forming the recording layer 3. However, the curve 701 in FIG. 5 is a circular arc having the same length as the maximum length L of the recording layer along the direction of easy-axis, and hence control is easy, resulting in a small effect of variations. Herein, the circular arc is shown, however, other curves described as a quadratic functions are also acceptable.

Herein, a consideration will be expediently given to the case where L/2=a and a=b in respective parameters defined in FIG. 5. In this case, the recording layer 3 is in such a shape that the right-hand side portion of the easy-axis 63 is a semicircle, so that L/W=1. With such a shape, the effect of magnetic anisotropy utilizing the shape cannot be obtained. Thus, the magnetic characteristics of the recording layer 5 may be isotropic. Further, it becomes difficult to obtain a difference in shape effect between the left and right portions of the easy-axis 63.

However, in the recording layer 3 of FIG. 5, a>b. Therefore, the circular arc 703 is predominant in formation of magnetization distribution. Accordingly, the C type magnetization distribution is formed. Further, L/2>a is satisfied. For this reason, the anisotropy due to the shape tends to be obtained, and thus, it is possible to stabilize the reversal characteristics and also to largely obtain the MR ratio. Similarly, assuming the case where b=0, it is required that L/2>W=a. Incidentally, for the recording layer 3 shown in FIG. 13, L/2<W.

Whereas, a ferromagnetic substance is present over the easy-axis 63 within the region of the maximum length L. As a result, the circular arc 703 can determine magnetization distribution. In other words, when the recording layer 3 has a portion in which there is no ferromagnetic substance over the easy-axis 63 within the region of the maximum length L, the effect of the curve or the straight line on the portion increases. Thus, it becomes difficult to control magnetization distribution by the curve 703.

With a highly integrated device such as an MRAM, it is actually difficult to evenly finish the shape of the recording layer 3 for all the magnetic memory elements MM. Therefore, assuming that in the film planar shape of the recording layer 3 according to a conventional example, the recording layer 3 has variations, the astroid curve of the recording layer 3 is indicated with 37. Thus, the region 46 in which magnetization reversal of the recording layer can be carried out largely narrows, or writing of information becomes impossible.

For this reason, from the practical viewpoint, there is proposed the configuration of this embodiment capable of preventing variations in wiring current for magnetization reversal due to the asymmetry of the shape in the film plane direction of the recording layer 3 of magnetic memory elements arrayed in a matrix.

Figure 20:
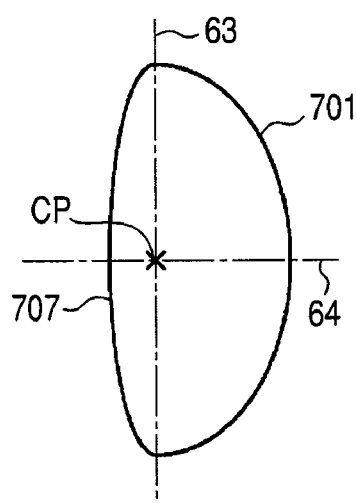
FIG. 20 is a plan view schematically showing the planar shape of the recording layer in a first modified example of one embodiment of the present invention.
Figure 21:
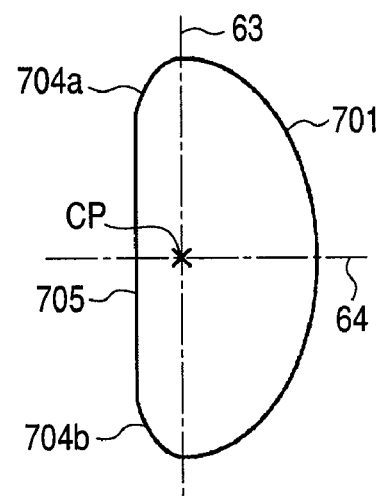
FIG. 21 is a plan view schematically showing the planar shape of the recording layer in a second modified example of one embodiment of the present invention.
Figure 22:
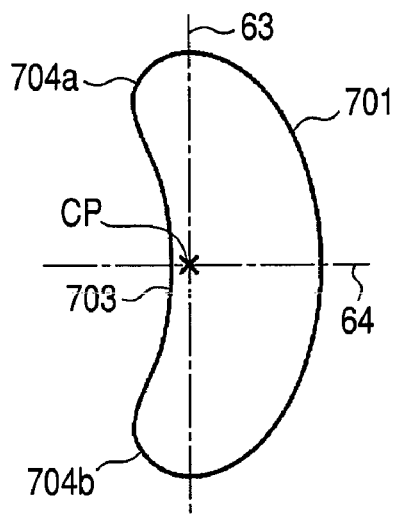
FIG. 22 is a plan view schematically showing the planar shape of the recording layer in a third modified example of one embodiment of the present invention.

FIGS. 20 to 22 respectively show plan views schematically showing the planar shapes of the recording layers in first to third modified examples of Embodiment 1 of the present invention. Referring to FIGS. 20 to 22, also when the recording layers in the shapes shown in these figures are used, the same effects are obtained by satisfying the same conditions as those for the recording layer 3 shown in FIG. 5.

According to this embodiment, the planar shape of the recording layer 3 is a shape capable of enlarging the radius of curvature of C type magnetization distribution. Whereas, the first part 3a of the recording layer 3 includes only a smooth curve convex outwardly of the outer edge, and hence is in the shape formed with stability by photolithography. This controls variations in the current necessary for changing the magnetization direction of the recording layer, namely, the write current. As a result, it is possible to obtain a magnetic memory device stable in write characteristics.

Incidentally, particularly, if the first part 3a has a portion to be a corner or a concave portion upon reduction of size of the recording layer 3, variations in shape of the recording layer 3 increase between the memory cells MC due to the difficulty of controllability of photolithography. Accordingly, variations are caused in write characteristics between the memory cells MC, resulting in an increase in variations of the write characteristics of the magnetic memory device.

In this embodiment, preferably, the first part 3a has the second straight line 64 as the symmetry axis. This can more largely ensure the radius of curvature of magnetization distribution of the recording layer 3.

By using a quadratic curve for the outer edge of the first part 3a, the shape of the first part 3a satisfying the requirements can be obtained with ease. Particularly, when the first part 3a includes an ellipse arc, the radius of curvature of the outer edge of the first part 3a can be more increased.

Further, the second part 3b has a concave portion in the edge of the planar shape. This can facilitate the formation of C type magnetization distribution. Further, this can prevent the occurrence of reflux of magnetization.

Embodiment 2

Figure 23:
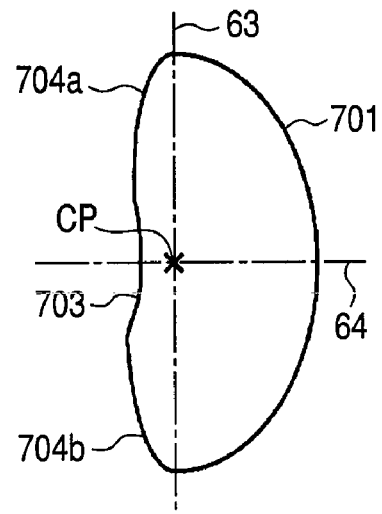
FIG. 23 is a plan view schematically showing the planar shape of the recording layer of a magnetic memory device in Embodiment 2 of the present invention.

FIG. 23 is a plan view schematically showing the planar shape of the recording layer of a magnetic memory device in Embodiment 2 of the present invention.

Referring to FIG. 23, for the shape of the recording layer of this embodiment, the curves 704a and 704b are different in curvature, and are asymmetric with respect to the direction of hard-axis. In this recording layer, the substantial shape easy axis is inclined with respect to the first straight line 63. For the astroid curve in this case, as described with the plot 36 of FIG. 12, the currents are different in magnitude as well as orientation for writing of "1" and "0". However, variations in write current due to the shape variations are small. By making use of this, it is possible to correct the difference in magnitude between the currents for writing of "1" and "0" generated by leakage field from the pinned layer, or magnetic coupling acting between the recording layer and the pinned layer due to the pinned layer roughness.

Incidentally, the configuration other than the foregoing is roughly the same as the configuration of Embodiment 1 described above. Therefore, the same or corresponding elements are given the same reference numbers and signs, and a description thereon will not be repeated.

According to this embodiment, the second part 3b has asymmetry with respect to the second straight line 64. Also in this case, as described in Embodiment 1, variations in write characteristics of the magnetic memory device are controlled. As a result, even when the second part 3b having symmetry is difficult to stably form due to the fineness of the recording layer 3, it is possible to stabilize the write characteristics of the magnetic memory device.

Embodiment 3

Figure 24:
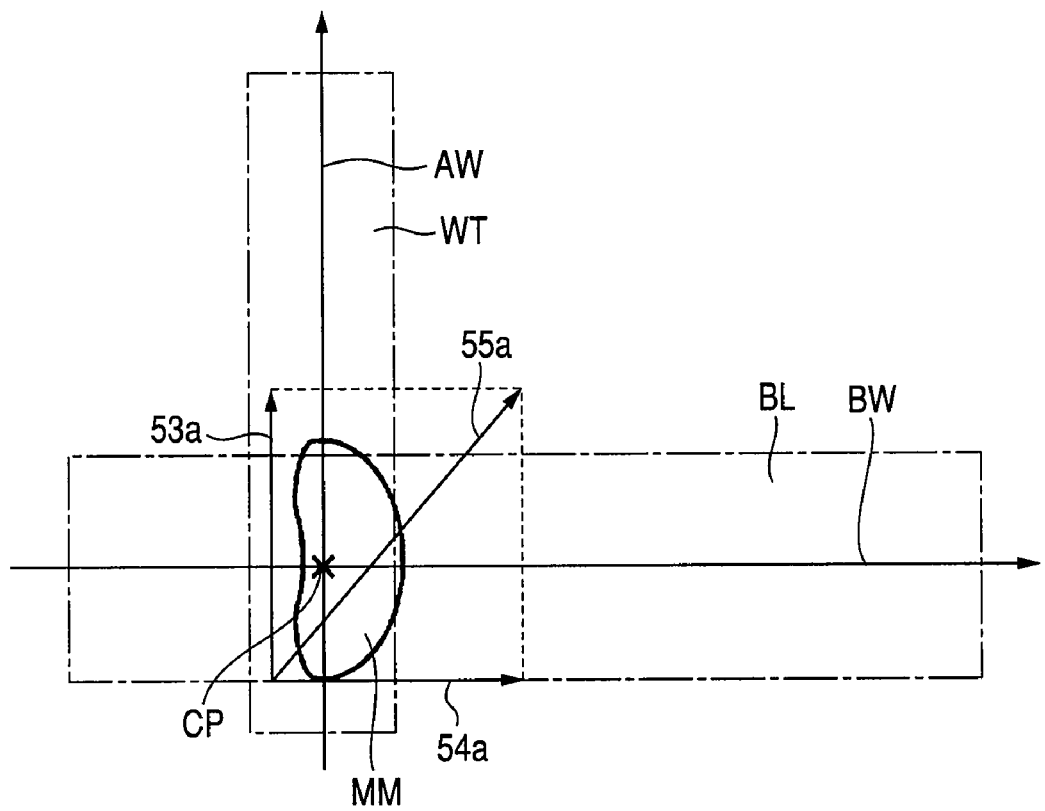
FIG. 24 is an explanatory view of the position of the recording layer of a magnetic memory device in Embodiment 3 of the present invention, and a plan perspective view of a magnetic memory element.

FIG. 24 is an explanatory view of the position of the recording layer of a magnetic memory device in Embodiment 3 of the present invention, and is a plan perspective view of the magnetic memory element. Referring to FIG. 24, the crossing position CP is situated at the point of intersection of the first axis AW of the write line WT and the second axis BW of the bit line BL in a plan view.

Incidentally, the configuration other than the foregoing is roughly the same as the configuration of Embodiment 1 described above. Therefore, the same or corresponding elements are given the same reference numbers and signs, and a description thereon will not be repeated.

According to this embodiment, it is possible to uniformly apply a magnetic field from, for example, the write line WT to the maximum length portion along the easy-axis 91 of the recording layer 3 shown in FIG. 5. In this case, the magnetic field from the bit line BL is also applied symmetrically with respect to the direction of hard-axis in writing of "1" or "0". This enables efficient and stable magnetization reversal to be caused in the recording layer 3. As a result, power consumption is reduced, and the stable operation becomes possible.

Incidentally, also in this embodiment, as with Embodiments 1 and 2, the recording layer in each shape shown in FIGS. 20 to 23 may be used.

In respective embodiments described above, when the leakage field from the ferromagnetic layer forming the pinned layer 1 is superposed on the external magnetic field, the magnetization reversing magnetic field changes by the amount equivalent to that of the leakage filed component. Namely, the leakage field from the ferromagnetic layer forming the pinned layer 1 shifts the hard-axis direction threshold value. For this reason, when the hard-axis direction threshold value is shifted to the higher magnetic field side, it can be considered that writing of information becomes impossible. Whereas, when the hard-axis direction threshold value is shifted to the lower magnetic field side, it can be considered that non-selected magnetic memory element undergoes magnetic reversal by mistake by the magnetic field formed by making a current flow through the bit line BL and/or the write line WT. Namely, variations in hard-axis direction threshold value between elements may cause a write error.

In order to reduce the variations in hard-axis direction threshold value, the following may be implemented. The leakage field component is made zero at every magnetic memory element MM. Alternatively, the leakage fields from the pinned layer 1 when an external magnetic field is not applied thereto are made equal at all the magnetic memory elements MM. In addition, the tilts of directions of magnetization of the pinned layer 1 when an external magnetic field is applied thereto are made equal at all the magnetic memory elements MM.

Further, the magnetic memory device of each of the respective embodiments may be a merged device having a logic circuit merged with the memory cell MC (FIG. 1). In this case, stabilization of the write characteristics enables high speed operation. This improves the interactive handling environment of information in a network environment or mobile communication. Further, by applying the magnetic memory device to a computer, a portable terminal, or the like, it is possible to largely implement the reduction of power consumption, the improvement of the operational environment, and the like.

Further, in respective embodiments described above, the magnetic memory devices were described. However, the relation between the magnetoresistive element such as the magnetic memory element MM and the wiring layer in association with the write line and the bit line is not limited to information memory. The relation can be applied to a magnetic device including, for example, a patterned magnetic element such as a magnetic sensor, a magnetic recording head, or a magnetic recording medium.

Further, a description was also given to the magnetic memory device including one magnetic memory element MM arranged in one memory cell MC. However, it is also acceptable that a plurality of magnetic memory elements MM are arranged in one memory cell MC. Further, it is also acceptable that the magnetic memory elements MM are stacked one on another.

It is noted that the embodiments disclosed this time are only illustrative in all respects, and that the present invention is not limited thereto. It is intended that the present invention is not shown by the scope of the description mentioned above but by the scope of claims. It is intended that the present invention includes the equivalent meaning as the scope of the claims, and all the changes within the scope.

The present invention can be in particular advantageously applied to a magnetic memory device having a recording layer.

What is claimed is:

1. A magnetic memory device, comprising:
a substrate;
a first wire arranged over the substrate, and having a part extending with a first axis as the central axis along the first axis;
a second wire arranged over the substrate, having a part extending along a second axis as the central axis crossing with the first axis, and crossing with the first wire with a space in the direction of thickness of the substrate provided therebetween; and
a recording layer having a planar shape, placed so as to be at least partially interposed between the first wire and the second wire in the region in which the first wire and the second wire cross each other with the space provided therebetween, having an easy-axis, and being changed in magnetization direction by the synthetic magnetic field of the magnetic field by the first wire and the magnetic field by the second wire,
wherein the planar shape has the maximum length in the direction of the easy-axis over a primary straight line along the easy-axis, and the planar shape has a width smaller than half of the maximum length in the direction perpendicular to the easy-axis, and
on one side and on the other side of the primary straight line respectively, the planar shape has a first part having a first length in the direction perpendicular to the easy-axis, and a second part having a second length smaller than the first length in the direction perpendicular to the easy-axis, and
wherein the outer edge of the first part includes only a smooth curve convex outwardly of the outer edge, and the second part has a concave part in the edge of the planar shape.

2. The magnetic memory device according to claim 1, wherein the first part has a symmetry axis perpendicular to the easy-axis.

3. The magnetic memory device according to claim 2, wherein the second part has asymmetry with respect to the symmetry axis.

4. The magnetic memory device according to claim 1, wherein the curve is a quadratic curve.

5. The magnetic memory device according to claim 1, wherein the middle point of the part included in the planar shape of the primary straight line is, in a plan view, situated at the point of intersection between the first axis and the second axis.

* * * * *